(12) United States Patent
Nakano et al.

(10) Patent No.: US 8,654,559 B2
(45) Date of Patent: Feb. 18, 2014

(54) SEMICONDUCTOR MEMORY DEVICE

(75) Inventors: Takashi Nakano, Osaka (JP); Yukio Tamai, Osaka (JP); Nobuyoshi Awaya, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 156 days.

(21) Appl. No.: 13/215,594

(22) Filed: Aug. 23, 2011

(65) Prior Publication Data

US 2012/0069626 A1 Mar. 22, 2012

(30) Foreign Application Priority Data

Sep. 17, 2010 (JP) ................................. 2010-209197

(51) Int. Cl.
*G11C 11/00* (2006.01)

(52) U.S. Cl.
USPC .......................................................... 365/148

(58) Field of Classification Search
USPC .......................................................... 365/148
See application file for complete search history.

(56) References Cited

U.S. PATENT DOCUMENTS

| | | | |
|---|---|---|---|
| 6,204,139 B1 | 3/2001 | Liu et al. | |
| 6,815,744 B1 | 11/2004 | Beck et al. | |
| 2004/0114438 A1 | 6/2004 | Morimoto | |
| 2004/0130939 A1 | 7/2004 | Morikawa | |
| 2006/0181929 A1* | 8/2006 | Kotani et al. | 365/185.22 |
| 2009/0010039 A1* | 1/2009 | Tokiwa et al. | 365/148 |
| 2009/0168504 A1* | 7/2009 | Lee et al. | 365/163 |
| 2009/0262582 A1* | 10/2009 | Chae et al. | 365/185.19 |
| 2010/0193951 A1* | 8/2010 | Dussarrat et al. | 257/741 |

FOREIGN PATENT DOCUMENTS

| | | |
|---|---|---|
| JP | 2002-537627 | 11/2002 |
| JP | 2004-185754 | 7/2004 |
| JP | 2004-185755 | 7/2004 |
| JP | 2007-004849 | 1/2007 |
| WO | WO 2009/145308 A1 | 12/2009 |

OTHER PUBLICATIONS

"Electric-pulse-induced reversible resistance change effect in magnetoresistive films", by Liu, S. Q., et al., Applied Physics Letter, vol. 76, pp. 2749-2751, 2000.
"Bistable Switching in Electroformed Metal-Insulator-Metal Devices", by H. Pagnia, et al., Phys. Stat. Sol. (a), vol. 108, pp. 11-65, 1988.
"Highly Scalable Non-volatile Resistive Memory using Simple Binary Oxide Driven by Asymmetric Unipolar Voltage Pulses", by Baek, I.G., et al., IEDM2004, pp. 587-590, 2004.

* cited by examiner

*Primary Examiner* — Huan Hoang
*Assistant Examiner* — Min Huang
(74) *Attorney, Agent, or Firm* — Nixon & Vanderhye, P.C.

(57) ABSTRACT

The invention provides a semiconductor memory device including a variable resistance element capable of decreasing a variation of a resistance value of stored data due to a large number of times of switching operations and capable of performing a stable writing operation. The device has a circuit that applies a reforming voltage pulse to a memory cell including a variable resistance element of a degraded switching characteristic and a small read margin due to a large number of times of application of a write voltage pulse, to return each resistance state of the variable resistance element to an initial resistance state. By applying the reforming voltage pulse, the variable resistance element can recover at least one resistance state from a variation from the initial resistance state, and can recover the switching characteristic. Accordingly, there is obtained a semiconductor memory device in which a reduction of a read margin is suppressed.

18 Claims, 35 Drawing Sheets

Number of Times of
Programming/Erasing Operation

Number of Times of
Programming/Erasing Operation

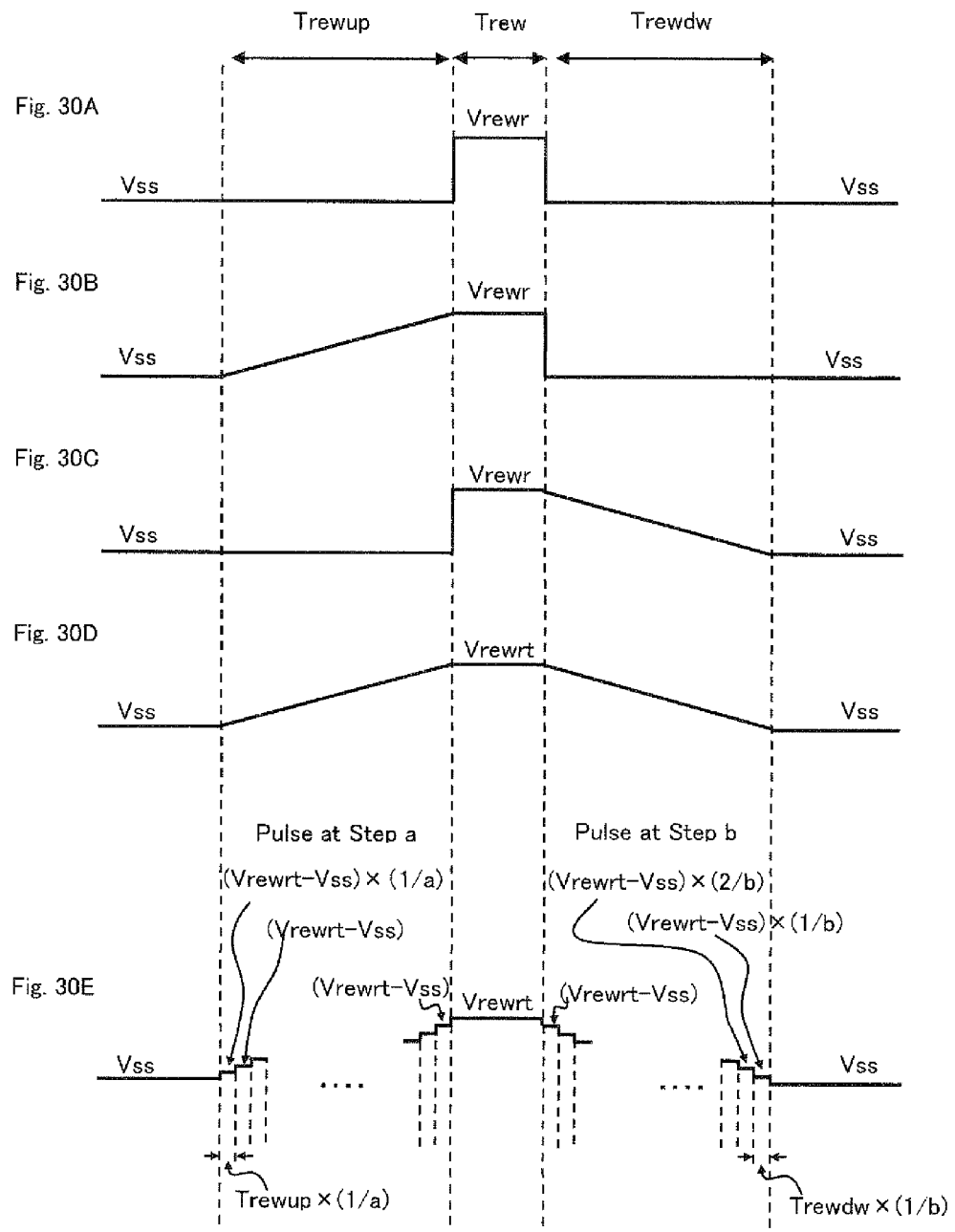

SEMICONDUCTOR MEMORY DEVICE

CROSS REFERENCE TO RELATED APPLICATION

This Nonprovisional application claims priority under 35 U.S.C. §119(a) on Patent Application No. 2010-209197 filed in Japan on Sep. 17, 2010 the entire contents of which are hereby incorporated by reference.

BACKGROUND OF THE INVENTION

1. Field of the Invention

The present invention relates to a semiconductor memory device that has a memory cell array having a plurality of memory cells arranged in a row direction and a column direction respectively, each memory cell including a variable resistance element that stores information based on an electrical operating characteristic that an electric resistance changes by applying electrical stress. More specifically, the present invention relates to a technique of preventing and suppressing degradation of an electrical operating characteristic of a variable resistance element attributable to programming and erasing operations.

2. Description of the Related Art

A nonvolatile semiconductor memory device as represented by a flash memory is being used as a large-capacity and compact information recording medium in a wide range of fields such as computers, communications, measuring devices, automatic control devices, and daily equipment that is used in the individuals' environments. Demand for a lower-cost and larger-capacity nonvolatile semiconductor memory device is very high. A main reason is assumed that the nonvolatile semiconductor memory device can exhibit functions as a memory card, a mobile phone, and the like that can be easily carried, or as a data storage, a program storage, and the like that store data in a nonvolatile manner as initial setting of a device operation, because the nonvolatile semiconductor memory device can electrically write data and also because the device can keep a nonvolatile characteristic that data is not erased even after a power supply is disconnected.

A mobile phone is pointed out as a representative application device of a flash memory. In a condition that a large capacity-constraint is applied to a power supply because of an extremely strong demand for miniaturization of a mobile phone, for example, a nonvolatile flash memory that does not require a backup power supply to hold information even during a long waiting time is suitable. Further, based on an enlarged memory capacity of a flash memory itself, the flash memory can store many application programs and many pieces of data, and can perform application programs by changing over between them, thereby contributing to multi-functioning of a mobile phone.

In the semiconductor memory device described above, because of a tendency of an increasing size of an application program and data themselves, a practical application of a system that can write software stored in the semiconductor memory device, can correct bugs, and can upgrade functions is required in the future. However, a conventional flash memory requires a very long time to write data, and therefore, there is a limit to an amount of data that can be written at one time. Further, there is a problem in that a data write procedure becomes very complex, such as for example, it is necessary to secure an additional storage area to buffer a file.

Further, it is predicted that, in principle, a flash memory has a limit in miniaturization, and a new-type nonvolatile semiconductor memory device that replaces the flash memory is being widely studied. Among others, a resistance random-access semiconductor memory, which uses a phenomenon that an electric resistance changes when a voltage is applied to a metal oxide film, is very advantageous as compared with a flash memory in the point of the miniaturization limit, and also high-speed data writing is possible. Therefore, researches and developments are actively progressed.

Taking an example, a method of reversibly changing an electric resistance by applying a voltage pulse to a Perovskite material which is known as a colossal magnet resistance effect by S. Liu and A. Ignatiev, et al. of the University of Houston, U.S. is disclosed in U.S. Pat. No. 6,204,139, and "Electric-pulse-induced reversible resistance change effect in magnetoresistive films", by Liu, S. Q., et al., Applied Physics Letter, Vol. 76, pp. 2749-2751, 2000. This is a remarkable breakthrough achievement in that a resistance change over several digits appears even at a room temperature without application of a magnetic field while using a Perovskite material known as the colossal magnet resistance effect. A RRAM (Resistance Random Access Memory) as a resistance non-volatile memory that uses a variable resistance element utilizing this phenomenon does not use a magnetic field at all unlike an MRAM, and therefore, has excellent characteristics in that power consumption is extremely low, miniaturization and high integration are easy, and that multilevel storage is possible because of a remarkably wide dynamic range of a resistance change as compared with that of the MRAM. A basic structure of an actual device is extremely simple, and FIG. 31 shows a configuration of this device.

As shown in FIG. 31, a variable resistance element has such a structure that a lower electrode 103, a variable resistor 102, and an upper electrode 101 are sequentially stacked in this order. The variable resistance element has a characteristic that it can reversibly change a resistance value when a voltage pulse is applied between the upper electrode 101 and the lower electrode 103. By reading a resistance value that changes based on this reversible resistance change operation (hereinafter referred to as "switching operation"), a novel semiconductor memory device can be achieved.

As other variable resistance element, an element that uses an oxide of a transition metal element such as a titanium oxide ($TiO_2$) film, a nickel oxide film (NiO) film, a zinc oxide (ZnO) film, and a niobium oxide ($Nb_2O_5$) film also exhibits a reversible resistance change, as is known from Japanese Unexamined Patent Application Publication (Translation of PCT Application) No. 2002-537627, and "Bistable Switching in Electroformed Metal-Insulator-Metal Devices", by H. Pagnia, et al., Phys. Stat. Sol. (a), vol. 108, pp. 11-65, 1988. A phenomenon of a switching operation that uses NiO is reported in detail in "Highly Scalable Non-volatile Resistive Memory using Simple Binary Oxide Driven by Asymmetric Unipolar Voltage Pulses", by Baek, I. G., et al., IEDM2004, pp. 587-590, 2004.

A semiconductor memory device can be configured by forming a memory cell array by having a plurality of memory cells arranged in a row direction and a column direction respectively in a matrix shape, each memory cell including a variable resistance element configured by the variable resistor described above and storing information by changing an electric resistance of the variable resistance element, and by arranging, around the memory cell array, a circuit that controls programming, erasing, and reading of data to/from each memory cell of the memory cell array.

This semiconductor memory device is configured by forming a memory cell array by having a plurality of memory cells arranged in a row direction and a column direction respectively in a matrix shape, each memory cell including a variable resistance element, and also by having arranged a peripheral circuit that controls programming, erasing, and reading operations of data to and from each memory cell of the memory cell array. For this memory cell, there are a memory cell (called "1T/1R type") that is configured by one select transistor T and one variable resistance element R, and a memory cell (called "1R type") that is configured by only one variable resistance element R, depending on a difference of a constituent element of each memory cell. Among these, FIG. 32 shows a configuration example of the 1T/1R type memory cell. For the 1T/1R type memory cell, two types of configuration can be considered depending on which one of a variable resistance element and a select transistor is connected to a bit line side (for example, see Japanese Unexamined Patent Publication No. 2004-185755 and Japanese Unexamined Patent Publication No. 2004-185754).

FIG. 32 schematically shows a configuration example of a memory cell array 15b of the 1T/1R type memory cells. In this memory cell array configuration, the memory cell array 15b has m×n memory cells 2 arranged at cross points of m bit lines (BL1 to BLm) that extend in a column direction, and n word lines (WL1 to WLn) that extend in a row direction. In addition, n source lines (SL1 to SLn) are arranged in parallel with the word lines. In each memory cell, an upper electrode of a variable resistance element 12 and a drain of a select transistor 13 are connected together, a lower electrode of the variable resistance element 12 is connected to a bit line, a gate electrode of the select transistor 13 is connected to a word line, and a source of the select transistor 13 is connected to a source line.

By configuring a memory cell 14b in a series circuit of the select transistor 13 and the variable resistance element 12 in this manner, the select transistor 13 of the memory cell 14b that is selected based on a potential of a word line becomes an ON state, and further, a program voltage or an erase voltage is selectively applied to only the variable resistance element 12 of the memory cell 14b that is selected based on a potential of a bit line, thereby making it possible to change a resistance value of the variable resistance element 12.

In a memory cell array that is configured by the 1T/1R type memory cells, when selecting a memory cell from which or to which data is to be read, programmed, and erased, a predetermined bias voltage is applied to a selected word line and a selected bit line respectively, and only a select transistor that is included in a selected memory cell connected to both the selected word line and the selected bit line is set to an ON state. With this arrangement, a read current and program/erase currents can be passed to only a variable resistance element that is included in the selected memory cell. Therefore, by including the select transistor in the memory cell, a configuration of a peripheral circuit which is similar to a conventional flash memory can be used.

Next, a configuration example of a large-capacity semiconductor memory device that has a memory cell array formed by the 1R type memory cells will be described with reference to the drawings.

As shown in FIG. 33, each memory cell 14a is not configured by a series circuit of a select transistor and a variable resistance element, but is configured by a single unit of the variable resistance element 12. A memory cell array 15a is configured by arranging the 1R type memory cells 14a in a matrix shape. This is similar to a memory cell array that is disclosed in Japanese Unexamined Patent Publication No. 2004-185755, for example. Specifically, the memory cell array 15a is configured to have m×n memory cells 14a arranged at cross points of m bit lines (BL1 to BLm) that extend in a column direction and n word lines (WL1 to WLn) that extend in a row direction. In each memory cell 14a, an upper electrode of a variable resistance element 3 is connected to a word line, and a lower electrode of the variable resistance element 3 is connected to a bit line.

According to the memory cell array 15a configured by the 1R type memory cells 14a, in selecting a memory cell from which data is to be read, a similar bias voltage is also applied to a selected memory cell that is connected to a word line and a bit line common to the memory cell from which data is to be read. Therefore, a read current also flows through a memory cell other than the memory cell from which data is to be read. The read current that flows through the selected memory cell which is selected in units of rows or columns is detected as the read current of the memory cell from which data is to be read, by a column selection or a row selection. In a memory cell array 15 that is configured by 1R type memory cells 14, a read current also flows through a memory cell other than a memory cell from which data is to be read. However, this has an advantage in that a memory structure is simple and that a memory cell area and a memory cell array area become small.

FIG. 34 shows a conventional example of a voltage application procedure to each unit in a data reading operation of the memory cell array 15 that is configured by the 1R type memory cells 14. In reading data from a selected memory cell, a selected word line which is connected to the selected memory cell is maintained at a ground potential Vss, and a read voltage Vr is applied to all other unselected word lines and all bit lines during a reading period Tread. Because a voltage difference of the read voltage Vr is generated between the selected word line and all the bit lines during the reading period Tread, a read current corresponding to an electric resistance, that is, a memory state, flows through a variable resistance element of the selected memory cell, and data stored in the selected memory cell can be read. In this case, because the read current corresponding to a memory state of the selected memory cell which is connected to the selected word line flows through each bit line, data of a specific selected memory cell can be read by selectively reading the read current that flows through a predetermined selected bit line, at a bit line side. In this case, arrangement can be such that the read current that flows through each word line is selectively read at the word line side, by replacing a relationship between the bit lines and the word lines.

FIG. 35 shows a configuration example of a semiconductor memory device that includes a memory cell array 15a of the 1R type memory cells 14a. A specific memory cell within the memory cell array 15a corresponding to an address input that is inputted from an address line 18 to a control circuit 20 is selected by a bit line decoder 16 and a word line decoder 17, each operation of data programming, erasing, and reading is performed, and data is stored and read to and from a selected memory cell. Input/output of data between an external device (not shown) and the semiconductor memory device is performed via a data line 19.

The word line decoder 17 selects a word line of the memory cell array 15a corresponding to a signal inputted to the address line 18, and the bit line decoder 16 selects a bit line of the memory cell array 15a corresponding to an address signal inputted to the address line 18. The control circuit 20 controls each operation of programming, erasing, and reading of the memory cell array 15a. The control circuit 20 controls the word line decoder 17, the bit line decoder 16, a voltage application circuit 22 based on an address signal inputted from the address line 18, a data input signal (during programming) inputted from the data line 19, and a control input signal inputted from the control signal line 21 to perform each operation of reading, programming, and erasing of the memory cell array 15a. In the example shown in FIG. 35, although not shown in the figure, the control circuit 20 includes functions as a general address buffer circuit, a data input/output buffer circuit, and a control input buffer circuit.

The voltage application circuit 22 switches, corresponding to an operation mode, each voltage of a word line, a bit line, and a source line that are necessary to read, program, and erase in the memory cell array 15a, and supplies the switched voltage to the memory cell array 15a. In this case, Vcc denotes a power supply voltage of the semiconductor memory device, Vss denotes a ground voltage, Vwrt and Vrst denote a program voltage and an erase voltage, and Vr denotes a read voltage. Data is read from the memory cell array 15a via the bit line decoder 16 and a reading circuit 23. The reading circuit 23 determines a data state, transfers the determination result to the control circuit 20, and outputs the result to the data line 19.

Here, the variable resistance element is based on a phenomenon that the variable resistance element becomes a low resistance state or a high resistance state, when an area (hereinafter appropriately referred to as "filament path") is formed in which resistivity locally decreases in the variable resistor due to a heat increase by a current flowing through the variable resistance element, or when the filament path is broken, depending on a voltage application condition.

To achieve the switching operation, first, it is necessary to form a filament path by applying a voltage which is required to be higher than a voltage in a normal switching operation to a variable resistance element immediately after manufacturing the variable resistance element (hereinafter referred to as "forming process"). In this forming process, in the case of configuring a variable resistor by a metal oxide, for example, a high voltage which is a few times to ten times higher than a normal operation voltage is applied to a metal oxide that is basically substantially an insulator, for a certain period of time or more. In this manner, a current path is considered to be almost forcibly formed in the insulator. This occurs because an element before forming is basically an insulator, or because at least a part of the current path near an electrode interface is originally an insulator.

Since this forming process is a process of forcibly forming a current path in an insulator, a switching characteristic of a variable resistance element that is achieved through this process tends to be unstable, and resistance value control becomes difficult.

That is, since the resistance value of the variable resistance element depends on a formation of the filament path, the resistance value of the variable resistance element varies due to a change in diameter of the filament path and a filament density because of increase in the number of times of switching operation. There is a problem that an element in a low resistance state does not have area dependence. When the number of times of switching operation increases, a variation of a resistance value becomes large, and resistance value control of the variable resistance element becomes difficult.

SUMMARY OF THE INVENTION

The present invention has been achieved in view of the above problems, and an object thereof is to provide a semiconductor memory device capable of decreasing a variation of a resistance value of a variable resistance element due to a large number of times of switching operations and capable of performing a stable writing operation.

First, a switching phenomenon of a variable resistance element newly invented by the inventors of the present application is described.

The inventors of the present application have found that when a voltage pulse (hereinafter, appropriately referred to as "reforming voltage pulse") different from any voltage pulse (a write voltage pulse) necessary for the switching operation is applied to a variable resistance element of which a resistance value control is difficult because of a large variation due to the large number of times of switching operations, a switching characteristic is recovered and the variable resistance element exhibits a satisfactory switching characteristic by a subsequent application of a write voltage pulse.

FIGS. 28A and 28B and FIGS. 29A and 29B show results of performing a writing operation and a reforming operation to a variable resistance element, after forming the variable resistance element which includes an Hf oxide film (HfOx) as the variable resistor which is a kind of a transition metal oxide, Pt as an upper electrode thereof, and TiN as a lower electrode thereof. The Hf oxide film of the variable resistance element is formed by using a sputtering method at a room temperature. After forming the element, a program voltage pulse of a program voltage Vpp=+3V and a pulse width 1 μs is applied to the upper electrode, and the forming is performed. A voltage application to the upper electrode is performed based on the lower electrode.

As shown in FIG. 28A, when a program voltage pulse (a voltage of +4 V, a pulse width of 50 ns, and a pulse rise/fall time of 5 ns) and an erase voltage pulse (a voltage of −1.6 V, a pulse width of 50 ns, and a pulse rise/fall time of 5 ns) are alternately applied to the upper electrode of the variable resistance element, a ratio of a resistance value in a low resistance state to a resistance value in a high resistance state (hereinafter, referred to as "resistance change ratio") is equal to or larger than 10 times at an initial stage of voltage application. However, the resistance change ratio starts to become clearly small after a voltage application cycle exceeds around 10 to the fifth power. Thereafter, when a voltage is applied for 10 to the seventh power times, the resistance change ratio becomes twice as small.

Thereafter, a corresponding reforming voltage pulse (a voltage of +1.5 V, a pulse width of 50 ns, and a pulse rise/fall time of 1 ms) in place of the program voltage pulse and a corresponding reforming voltage pulse (a voltage of ~1.2 V, a pulse width of 50 ns, and a pulse rise/fall time of 1 ms) in place of the erase voltage pulse are alternately applied in three cycles. FIG. 28B shows a result of the subsequent switching operations. As shown in FIG. 28B, by using the same program voltage pulse and the same erase voltage pulse, a large number of times of switching operations having a resistance change ratio equal to or larger than ten times can be confirmed when a write voltage pulse of at least 10 to the fifth power times is applied.

As described above, it is clear that when the reforming voltage pulse is applied to the variable resistance element of which the resistance change ratio is small due to the large number of times of switching operations, the resistance change ratio becomes large and the switching operation can be performed again for a large number of times.

Although FIGS. 28A and 28B show results of alternately applying the reforming voltage pulse corresponding to the program voltage pulse and the reforming voltage pulse corresponding to the erase voltage pulse, it is not necessary required to alternately apply a plurality of reforming voltage pulses for a plurality of times. Although this depends on an application condition of the reforming voltage pulse and a characteristic of the variable resistance element, when the reforming voltage pulse corresponding to at least one specific write voltage pulse is applied only once, a resistance state of the variable resistance element can transition back to an initial resistance state of a resistance state to which the resistance state of the variable resistance element is to transition by application of the specific write voltage pulse. In this case, by subsequent application of an arbitrary write voltage pulse, the resistance state of the variable resistance element can transition back to an initial resistance state of a resistance state to which the resistance state of the variable resistance element is to transition by application of the arbitrary write voltage pulse.

FIGS. 29A and 29B show results of performing a writing operation and a reforming operation to a variable resistance element after the variable resistance element which is different from the element shown in FIGS. 28A and 28B is manufactured by the method described above. In a similar manner to that shown in FIGS. 28A and 28B, a program voltage pulse (a voltage of +4 V, a pulse width of 50 ns, and a pulse rise/fall time of 5 ns) and an erase voltage pulse (a voltage of −1.6 V, a pulse width of 50 ns, and a pulse rise/fall time of 5 ns) are alternately applied to the upper electrode of the variable resistance element. As a result, as shown in FIG. 29A, a ratio of a resistance value in a low resistance state to a resistance value in a high resistance state (hereinafter, referred to as "resistance change ratio") is equal to or larger than 10 times at an initial stage of voltage application. However, the resistance change ratio becomes about few times smaller when the voltage application cycle is 10 to the seventh power.

However, thereafter, a corresponding reforming voltage pulse (a voltage of +1.5 V, a pulse width of 50 ns, and a pulse rise/fall time of 1 ms) is applied only once in place of the program voltage pulse. FIG. 29B shows a result of the subsequent switching operations. As shown in FIG. 29B, by using the same program voltage pulse and the same erase voltage pulse, a large number of times of switching operations having a resistance change ratio equal to or larger than ten times can be confirmed when a write voltage pulse of at least 10 to the fourth power times is applied.

The reforming voltage pulse described above is a pulse to recover a filament path. A variable resistance element to which writing cannot be performed by applying a short write voltage because of a degraded switching characteristic is considered to be able to recover the switching characteristic when a longer-time voltage pulse than this write voltage pulse is applied to the variable resistance element.

Similarly to the writing operation, a threshold voltage is present in the reforming operation described above, and it is known that a switching characteristic of a variable resistance element can be recovered by applying a reforming voltage pulse of which an absolute value of a voltage amplitude is equal to or larger than the threshold value. The threshold voltage in the reforming operation is considered to be about the same as a threshold voltage in the corresponding writing operation.

Therefore, it is sufficient that the voltage amplitude of the reforming voltage pulse is about equal to or higher than the threshold voltage in the corresponding writing operation, although this depends on a material of the variable resistor, a structure of the variable resistance element, and the like. However, to suppress damage generated in the filament path due to the long-time pulse application, it is desirable to apply a reforming voltage pulse of which an absolute value of a voltage amplitude is small. A pulse applying time which is necessary for the reforming changes depending on a height of the voltage amplitude of the reforming voltage pulse, and therefore, a longer applying time of the reforming voltage pulse is necessary when the voltage amplitude of the reforming voltage pulse is lower. Particularly, a variable resistance element that has a relatively thin filament can perform a high-speed and low current operation. On the other hand, the filament path can be easily damaged by the application of the voltage pulse. Therefore, an absolute value of a peak voltage amplitude of the reforming voltage pulse is set lower than that of the write voltage pulse.

Further, to suppress damage generated in the filament path due to a rapid voltage change, preferably, a rise time or a fall time of the reforming voltage pulse is set longer than a rise time or a fall time of the write voltage pulse, and a reforming voltage pulse of which a voltage changes slowly may be applied. Alternatively, instead of setting a rise time or a fall time of a pulse long, an absolute value of a voltage amplitude of a pulse is increased stepwise with time, or an absolute value of a voltage amplitude is decreased stepwise with time. Even when an applying time of a peak voltage of a reforming voltage pulse is the same as or shorter than a pulse applying time of a peak voltage of a write voltage pulse, a reforming effect can be obtained by setting a rise time or a fall time longer than a write voltage pulse and by setting a total pulse applying time including a rise and a fall of a pulse longer than a write voltage pulse.

FIGS. 30A to 30E show examples of the reforming voltage pulse. FIG. 30A shows a rectangular pulse where a peak voltage amplitude of a voltage pulse is Vrewrt and an applying time of the peak voltage is Trew. FIG. 30B shows a pulse of which a rise time Trewup is long. FIG. 30C shows a pulse of which a fall time Trewdw is long. FIG. 30D shows a pulse of which both a rise time Trewup and a fall time Trewdw are long. Among these pulses, the pulse shown in FIG. 30D can most suppress damage generated in a filament path due to a rapid voltage change, and this pulse is most preferable. As shown in FIG. 30E, a pulse of which a voltage amplitude of a pulse increases or decreases stepwise with time is also preferable. The number of steps in the rise and fall of the pulse in FIG. 30E is determined by an absolute value of the reforming voltage (1.5 V, for example) and by a minimum voltage (0.1 V, for example) at which an application circuit of the reforming voltage pulse can be generated.

The present invention has been achieved based on the knowledge described above. In order to achieve the above-described object, a semiconductor memory device according to the present invention has a first characteristic that the semiconductor memory device includes: a variable resistance element in which electrodes are supported at both ends of a variable resistor, a resistance state specified by a current-voltage characteristic between the electrodes transitions between two or more different resistance states by applying electrical stress between the electrodes at the both ends, and one resistance state after the transition is used for storing information; and a circuit that applies a reforming voltage pulse to a memory cell after a write voltage pulse is applied a plurality of times, to recover at least one of the resistance states of the variable resistance element from a variation from an initial resistance state, the reforming voltage pulse being different from any of the write voltage pulses that cause each of the resistance states of the variable resistance element to transition to a different state.

The "initial resistance state" of the resistance state of the variable resistance element indicates a resistance state immediately after the forming process is completed, or any one of resistance states after the transitions due to application of the respective write voltage pulses that appear when the respective write voltage pulses are applied for the first time after the forming process is completed.

According to the first characteristic of the semiconductor memory device, the semiconductor memory device includes a circuit that applies a reforming voltage to a variable resistance element of which a switching characteristic is degraded and a read margin is small due to a large number of times of switching operations. Accordingly, each resistance state of the variable resistance element of which the switching characteristic is degraded can transition back to the initial resistance state, can recover the switching characteristic, and can avoid or suppress reduction of the read margin. Further, the semiconductor memory device can increase or avoid the number of times of operation until reaching a read inability state.

Further, the semiconductor memory device according to the present invention has a second characteristic, in addition to the first characteristic, that the semiconductor memory device includes a memory cell array having a plurality of memory cells, each including the variable resistance element, arranged in a row direction and a column direction respectively; a memory cell selecting circuit that selects one or a plurality of memory cells to which a memory operation is to be performed from among the memory cells in the memory cell array by controlling a voltage to be applied to each of the memory cells; a write voltage application circuit that generates the write voltage pulse and applies the write voltage pulse via the memory cell selecting circuit to the memory cells to be written selected by the memory cell selecting circuit; a reforming voltage application circuit that generates at least one reforming voltage pulse corresponding to any one of the write voltage pulses, and applies the reforming voltage pulse, via the memory cell selecting circuit, to the memory cells to be reformed selected by the memory cell selecting circuit; and a reading circuit that detects current flowing through the variable resistance element of each of the memory cells.

According to the second characteristic of the semiconductor memory device, the reforming voltage application circuit is configured to be able to apply the reforming voltage pulse in place of any one of the write voltage pulses that cause the resistance state to transition. The reforming voltage pulse is a voltage pulse to cause a resistance state of a variable resistance element to transition back to an initial resistance state of a resistance state to which it is to transition by applying a corresponding write voltage pulse, corresponding to any one of the write voltage pulses. For example, when a reforming voltage pulse corresponding to an erase voltage pulse is applied, the variable resistance element transitions back to an initial resistance state of an erase state, and when a reforming voltage pulse corresponding to a program voltage pulse is applied, the variable resistance element transitions back to an initial resistance state of a program state.

With this arrangement, each resistance state of a variable resistance element of which a switching characteristic is degraded can transition back to an initial resistance state, and reduction of a read margin can be avoided or suppressed. Further, the number of times of operation until reaching a read inability state can be increased, or reaching the read inability state itself can be avoided.

Further, the semiconductor memory device according to the present invention has a third characteristic, in addition to the second characteristic, that the write voltage application circuit applies any one of a first write voltage pulse and a second write voltage pulse to the memory cells to be written via the memory cell selecting circuit, the first write voltage pulse causing the resistance state of the variable resistance element to transition from a high resistance state to a low resistance state, and the second write voltage pulse causing the resistance state of the variable resistance element to transition from the low resistance state to the high resistance state, and the reforming voltage application circuit applies at least any one of a first reforming voltage pulse corresponding to the first write voltage pulse and a second reforming voltage pulse corresponding to the second write voltage pulse, to the memory cells to be reformed.

According to the third characteristic of the semiconductor memory device, the reforming voltage application circuit is configured to be able to apply the first reforming voltage pulse or the second reforming voltage pulse, corresponding to the first write voltage pulse that causes a resistance state to transition to a low resistance state and the second write voltage pulse that causes a resistance state to transition to a high resistance state respectively. By applying at least any of the first reforming voltage pulse in place of the first write voltage pulse and the second reforming voltage pulse in place of the second write voltage pulse, each resistance state of a variable resistance element of which a switching characteristic is degraded can transition back to an initial low resistance state or an initial high resistance state, and reduction of a read margin can be avoided or suppressed. Further, the number of times of operation until reaching a read inability state can be increased, or reaching a read inability state itself can be avoided.

Further, the semiconductor memory device according to the present invention has a fourth characteristic, in addition to the second or third characteristic, that at least one of the reforming voltage pulses is a long-pulse reforming voltage pulse of which a pulse applying time is longer than that of the write voltage pulse to which the reforming voltage pulse is related.

Here, the pulse applying time indicates a total pulse applying time including the rise and fall times of the voltage pulse.

Further, the semiconductor memory device according to the present invention has a fifth characteristic, in addition to the fourth characteristic, that an absolute value of a peak voltage of the long-pulse reforming voltage pulse is smaller than that of the write voltage pulse to which the long-pulse reforming voltage pulse is related.

Further, the semiconductor memory device according to the present invention has a sixth characteristic, in addition to the fourth or fifth characteristic, that the long-pulse reforming voltage pulse has a pulse rise time or a pulse fall time which is longer than that of the write voltage pulse to which the long-pulse reforming voltage pulse is related.

Further, the semiconductor memory device according to the present invention has a seventh characteristic, in addition to the fourth or fifth characteristic, that the long-pulse reforming voltage pulse is a pulse in which an absolute value of an application voltage until reaching a peak voltage increases stepwise with time, or an absolute value of an application voltage after reaching a peak voltage decreases stepwise with time.

Further, the semiconductor memory device according to the present invention has an eighth characteristic, in addition to any of the second to seventh characteristics, that the semiconductor memory device further includes a write counter that stores the number of times of application of the write voltage applied by the write voltage application circuit via the memory cell selecting circuit, for each row or each column of the memory cell array, or for each sub-memory cell array formed by dividing the memory cell array, or for each memory cell array, wherein when a value of the write counter reaches a predetermined first set value, the reforming voltage application circuit applies the reforming voltage pulse to the memory cell related to the write counter, via the memory cell selecting circuit.

Further, the semiconductor memory device according to the present invention has a ninth characteristic, in addition to any of the second to eighth characteristics, that the semiconductor memory device further includes an ECC circuit; and an error counter for each row or each column of the memory cell array, or for each sub-memory cell array formed by dividing the memory cell array, or for each memory cell array, wherein the error counter stores the number of times of error correction performed by the ECC circuit, in reading information stored in the memory cell related to the error counter in the memory cell array, and when a value of the error counter reaches a predetermined second set value, the reforming voltage application circuit applies the reforming voltage pulse to the memory cell related to the error counter, via the memory cell selecting circuit.

Further, the semiconductor memory device according to the present invention has a tenth characteristic, in addition to any of the second to eighth characteristics, that the semiconductor memory device further includes an error counter for each row or each column of the memory cell array, or for each sub-memory cell array formed by dividing the memory cell array, or for each memory cell array, wherein the error counter stores the number of times the reading circuit detects that the current voltage characteristic of the variable resistance element of the memory cell related to the error counter in the memory cell array is outside a predetermined first set range, and when a value of the error counter reaches a predetermined second set value, the reforming voltage application circuit applies the reforming voltage pulse to the memory cell related to the error counter, via the memory cell selecting circuit.

Further, the semiconductor memory device according to the present invention has an eleventh characteristic, in addition to any of the second to eighth characteristics, that the semiconductor memory device further includes an error counter for each row or each column of the memory cell array, or for each sub-memory cell array formed by dividing the memory cell array, or for each memory cell array, wherein the error counter stores the number of times the reading circuit detects that an amount of current flowing through the variable resistance element of the memory cell to be written related to the error counter in the memory cell array is outside a predetermined second set range, when the write voltage pulse is applied, and when a value of the error counter reaches a predetermined second set value, the reforming voltage application circuit applies the reforming voltage pulse to the memory cell related to the error counter, via the memory cell selecting circuit.

Further, the semiconductor memory device according to the present invention has a twelfth characteristic, in addition to any of the second to eighth characteristics, that when the reading circuit detects that the current voltage characteristic of the variable resistance element in the memory cell array is outside a predetermined first set range, the reforming voltage application circuit applies the reforming voltage pulse via the memory cell selecting circuit to the memory cell that includes the variable resistance element of which the current voltage characteristic is outside the first set range.

Further, the semiconductor memory device according to the present invention has a thirteenth characteristic, in addition to any of the second to eighth characteristics, that when the reading circuit detects that an amount of current that flows through at least one of the variable resistance elements to be written is outside a predetermined second set range when the write voltage pulse is applied, the reforming voltage application circuit applies the reforming voltage pulse via the memory cell selecting circuit to the memory cell that includes the variable resistance element of which the amount of current is outside the second set range.

Further, the semiconductor memory device according to the present invention has a fourteenth characteristic, in addition to any of the second to thirteenth characteristics, that the semiconductor memory device includes a reforming counter that stores the number of times of application of the reforming voltage pulse, for each row or each column of the memory cell array, or for each sub-memory cell array formed by dividing the memory cell array, or for each memory cell array, wherein when a value of the reforming counter reaches a predetermined third set value, the reforming voltage application circuit applies the reforming voltage pulse via the memory cell selecting circuit to all the memory cells in the sub-memory cell array that includes all the memory cells related to the reforming counter, or to all the memory cells in the memory cell array.

Further, the semiconductor memory device according to the present invention has a fifteenth characteristic, in addition to any of the first to fourteenth characteristics, that the variable resistor contains an oxide or an oxynitride of a transition metal.

Further, the semiconductor memory device according to the present invention has a sixteenth characteristic, in addition to the fifteenth characteristics, that the variable resistor contains an oxide or an oxynitride of a transition metal selected from among Hf, Ta, Ti, Co, Ni, and Cu.

Therefore, the present invention provides a semiconductor memory device capable of recovering a switching characteristic of a variable resistance element by applying a reforming voltage to the variable resistance element of which a read margin is small due to a degraded switching characteristic, and capable of performing a stable writing operation by decreasing a variation of a resistance value of the variable resistance element due to a large number of times of switching operations.

BRIEF DESCRIPTION OF THE DRAWINGS

FIGS. 30A to 30E show an example of a voltage waveform of a reforming voltage pulse according to the present invention;

DETAILED DESCRIPTION OF PREFERRED EMBODIMENTS

A semiconductor memory device that can recover a resistance state of a variable resistance element from a degraded resistance change based on new knowledge of the variable resistance element will be described in detail below. First, a semiconductor memory device that has memory cells configured by only variable resistance elements, that is, 1R type memory cells, will be described in detail.

In the present invention, each memory cell that constitutes a memory cell array of the semiconductor memory device is formed to include a variable resistance element that stores information based on a change of an electric resistance. In embodiments shown below, an example of a variable resistance element is described by assuming a RRAM element of a three-layer structure that has a Pt electrode arranged on an Hf oxide film and has a TiN electrode arranged under the Hf oxide film. As the variable resistance element, the present invention can be applied to any variable resistance element that generates a resistance change attributable to generation and breaking of a filament path by application of a voltage or a current, that is, the element that requires a certain forming process before a switching operation. Among others, preferably, the present invention can be suitably applied to an element that supports electrodes at both ends of a variable resistor, by using an oxide or an oxynitride of a transition metal for the variable resistor. More preferably, the variable resistor may be configured by an oxide or an oxynitride of a transition metal selected from among Hf, Ta, Ti, Co, Ni, and Cu.

First Embodiment

Figure 1:
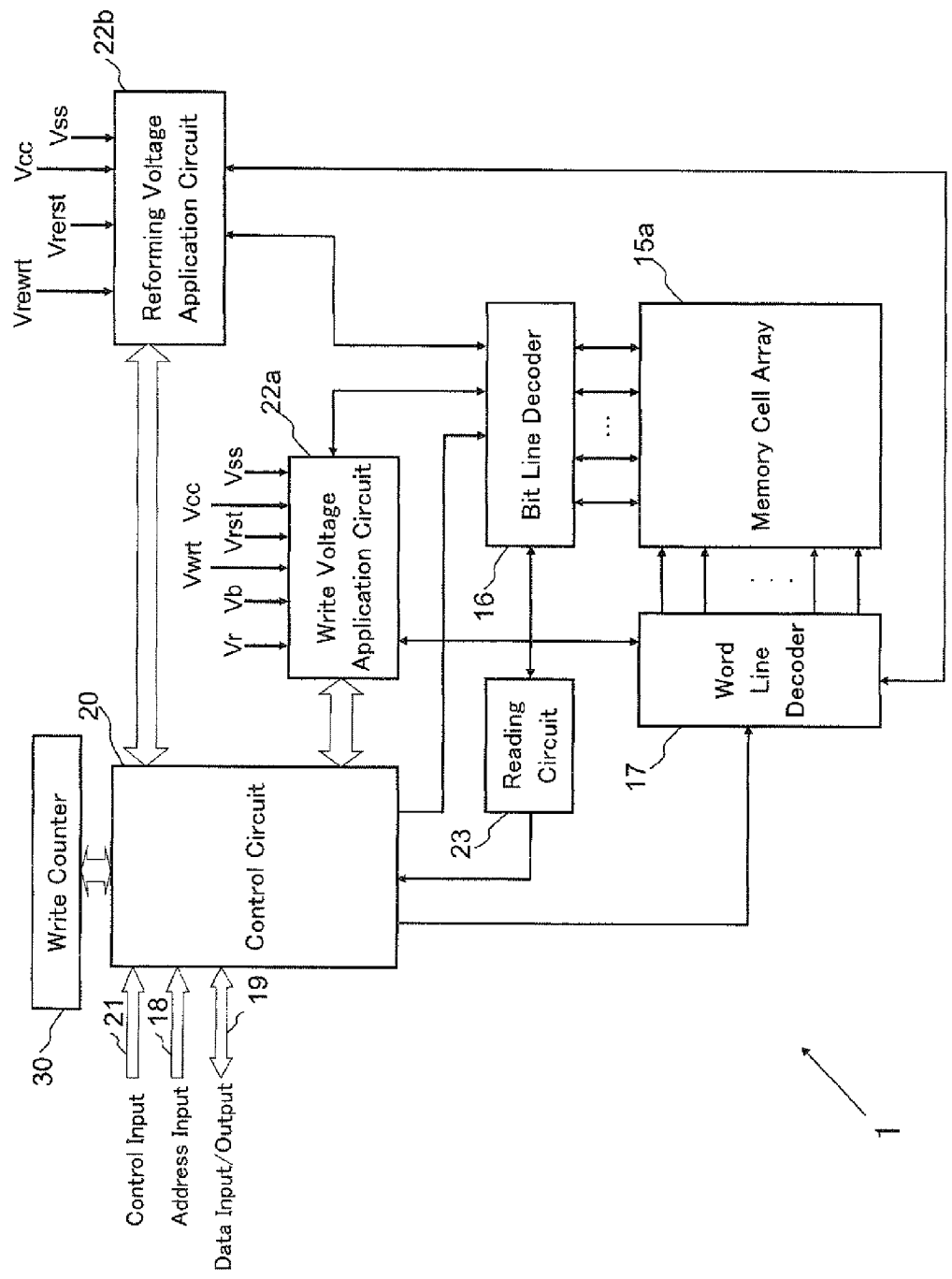
FIG. 1 is a circuit block diagram showing a configuration example of a semiconductor memory device according to a first embodiment of the present invention.

FIG. 1 shows a configuration example of a semiconductor memory device (hereinafter, appropriately referred to as "present invention device 1") according to an embodiment of the present invention. In FIG. 1, a portion that is common to that used for a conventional semiconductor memory device is denoted with a common reference symbol. As shown in FIG. 1, the present invention device 1 includes a bit line decoder 16, a word line decoder 17, a control circuit 20, a write voltage application circuit 22a, a reforming voltage application circuit 22b, a reading circuit 23, and a write counter 30, around a memory cell array 15a having 1R type memory cells (see reference symbol 14a in FIG. 2) arranged in a matrix shape.

Figure 2:
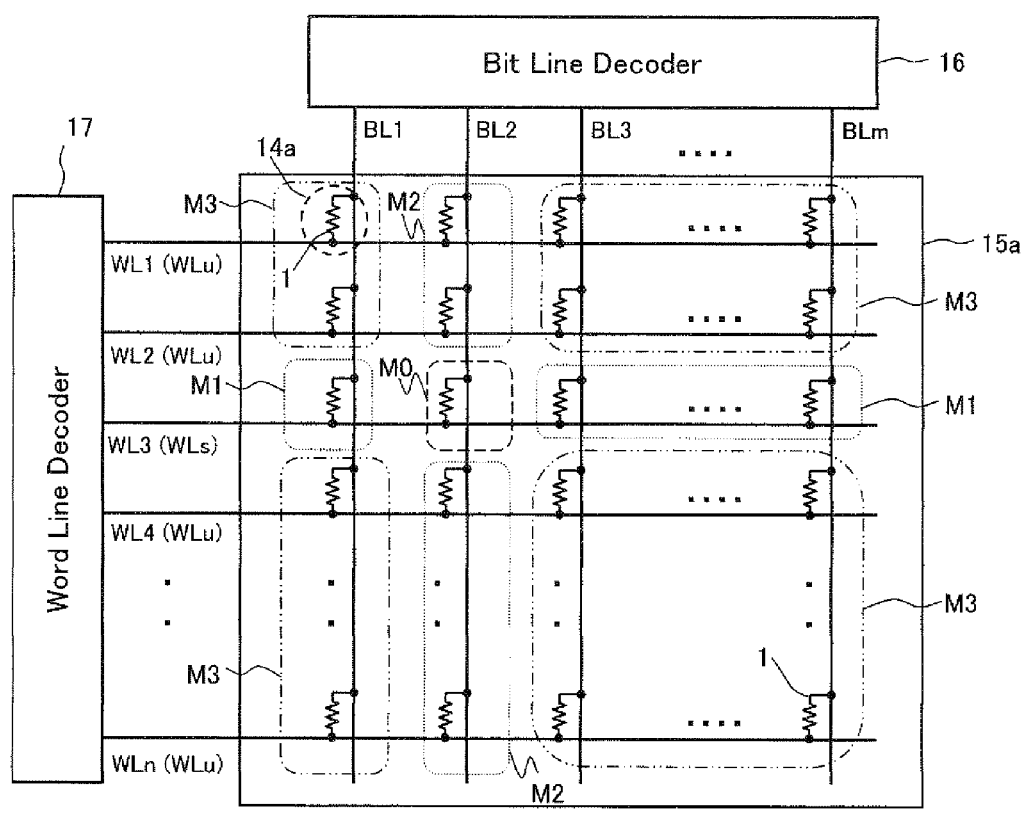
FIG. 2 shows a circuit configuration of a memory cell array that includes 1R type memory cells.

The memory cell array 15a has a similar structure to that of a memory cell array of the conventional semiconductor memory device. Specifically, as shown in FIG. 2, the memory cell array 15a is configured to have m×n memory cells 14a arranged at cross points of m bit lines (corresponding to column selection lines) BL1 to BLm that extend in a column direction and n word lines (corresponding to row selection lines) WL1 to WLn that extend in a row direction.

In each memory cell 14a, an upper electrode of a variable resistance element is connected to a word line, and a lower electrode of the variable resistance element is connected to a bit line. A relationship between the upper electrode and the lower electrode of the variable resistance element can be reversed such that the lower electrode of the variable resistance element is connected to a word line, and the upper electrode of the variable resistance element is connected to a bit line.

The bit line decoder 16 and the word line decoder 17 select a memory cell to which a memory operation is to be performed from the memory cell array 15a, based on an address input that is inputted from the address line 18 to the control circuit 20, in each memory operation of programming, erasing, reading, and reforming of the memory cell array 15a. The bit line decoder 16 selects a bit line of the memory cell array 15a corresponding to an address signal that is inputted to the address line 18, and the word line decoder 17 selects a word line of the memory cell array 15a corresponding to an address signal that is inputted to the address line 18. That is, in the present embodiment, the bit line decoder 16 selects a column of a memory cell to which the memory operation is to be performed from the memory cell array 15a, and the word line decoder 17 selects a row of a memory cell to which the operation is to be performed from the memory cell array 15a. With this arrangement, a function as a memory cell selecting circuit that selects the memory cell 14a to which the memory operation is to be performed is achieved, by the bit line decoder 16 and the word line decoder 17 together.

The control circuit 20 controls each operation of programming, erasing, reading, and reforming of the memory cell array 15a. The control circuit 20 controls each operation of reading, programming, erasing, and reforming performed by the bit line decoder 16, the word line decoder 17, the write voltage application circuit 22a, the circuits of the reforming voltage application circuit 22b, and the memory cell array 15a based on an address signal inputted from the address line 18, a data input signal (during programming) inputted from the data line 19, and a control input signal inputted from the control signal line 21. In the example shown in FIG. 1, although not shown in the figure, the control circuit 20 includes functions as a general address buffer circuit, a data input/output buffer circuit, and a control input buffer circuit.

The write voltage application circuit 22a switches, according to an operation mode, each voltage of a word line and a bit line necessary upon reading, programming, and erasing of the memory cell array 15a, and supplies the switched voltage to the memory cell 14a to be operated in the memory cell array 15a via the bit line decoder 16 and the word line decoder 17. In the present embodiment, in the programming or erasing operation, the write voltage application circuit 22a generates a predetermined write voltage pulse (a program voltage pulse and an erase voltage pulse), and applies this voltage pulse to a selected memory cell connected to one or a plurality of bit lines selected by the bit line decoder 16, via the bit line decoder 16. In FIG. 1, Vcc denotes a power supply voltage of the present invention device 1, Vss denotes a ground voltage, Vwrt denotes a program voltage, Vrst denotes an erase voltage, Vb denotes a bias voltage of the memory cell array, and Vr denotes a read voltage.

The reforming voltage application circuit 22b can be built in the write voltage application circuit 22a. The reforming voltage application circuit 22b generates a reforming voltage pulse necessary during reforming of the memory cell array 15a, and applies the generated reforming voltage pulse to a memory cell to which the reforming operation is to be performed in the memory cell array 15a, via the bit line decoder 16 or the word line decoder 17. In the present embodiment, all memory cells connected to one selected bit line selected by the bit line decoder 16 are selected, and a predetermined reforming voltage pulse is applied to the memory cells. In FIG. 1, Vcc denotes a power supply voltage of the present invention device 1, Vss denotes a ground voltage, Vrewrt denotes a program reforming voltage, and Vrerst denotes an erase reforming voltage.

The reading circuit 23 determines a resistance state of a variable resistance element of a memory cell to be read specified by a selected bit line and a selected word line, based on an amount of read current that flows through a selected bit line selected by the bit line decoder 16 out of the read current that flows through each bit line when a read voltage pulse is applied to a bit line connected to a selected memory cell, or based on a voltage obtained by converting the amount of current to a voltage, transfers the determination result to the control circuit 20, and outputs the result to the data line 19.

The write counter 30 stores a total number of times of application of a program voltage pulse and an erase voltage pulse applied by the write voltage application circuit 22a for each bit line or each word line of the memory cell array. That is, the write counter 30 stores the number of times of application of a write voltage pulse by the write voltage application circuit 22a via the bit line decoder 16 or the word line decoder 17, for each memory cell belonging to the same row or the same column in the memory cell array.

Figure 3:
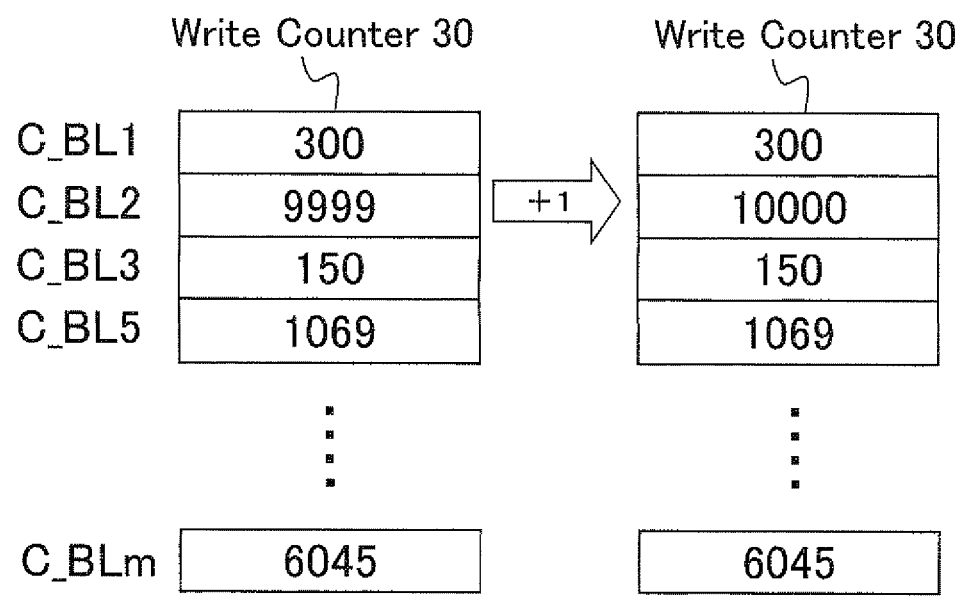
FIG. 3 is a conceptual diagram showing a configuration example of a write counter.

FIG. 3 shows a conceptual diagram of a configuration of the write counter 30. In the present embodiment, the write counter 30 is provided for each bit line of the memory cell array, and stores a total number of times of application of a write voltage pulse, for each memory cell belonging to the same column. The write counter 30 has an initial value 0, and 1 is added to a counter corresponding to a selected bit line each time when one programming or erasing operation is completed. For example, when a program voltage is applied to the bit line BL2, 1 is added to the number of times of writing in a counter C_BL2, and the resultant value is stored in the write counter 30 as the number of times of writing in BL2.

When the counter C_BL2 of a certain bit line (BL2 in this case) reaches a predetermined first set value (10000 in this case), the reforming voltage application circuit applies a reforming voltage pulse to the target bit line via the bit line decoder 16.

A detailed operation of programming, erasing, and reforming will be described with reference to FIG. 2 and FIGS. 4 to 7. In the following description, an operation of applying a program reforming voltage pulse to a memory cell is called a program reforming, and an operation of applying an erase reforming voltage pulse to a memory cell is called an erase reforming.

Figure 4:
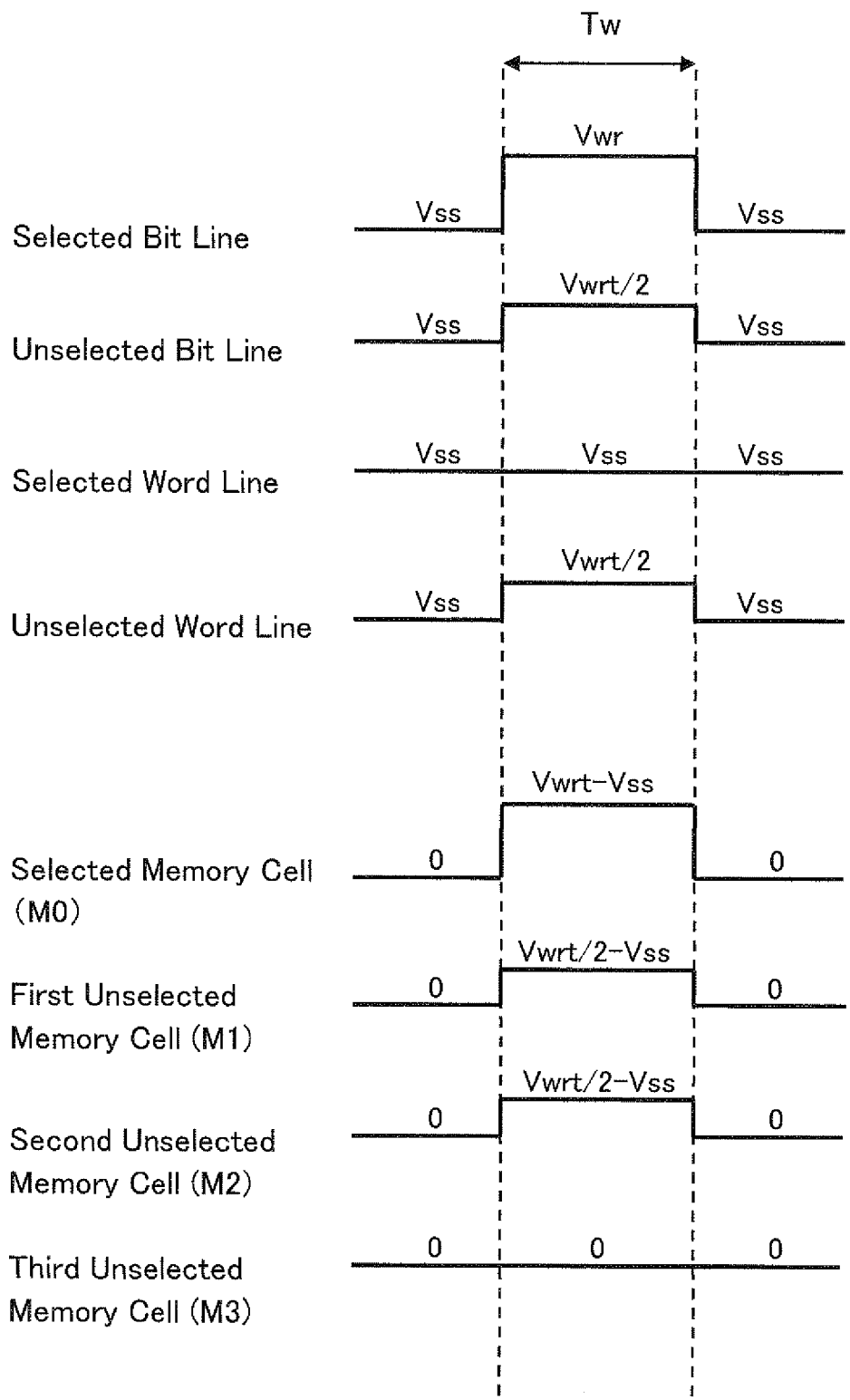
FIG. 4 shows an example of a voltage application procedure to a memory cell array during a programming operation in the present invention.
Figure 5:
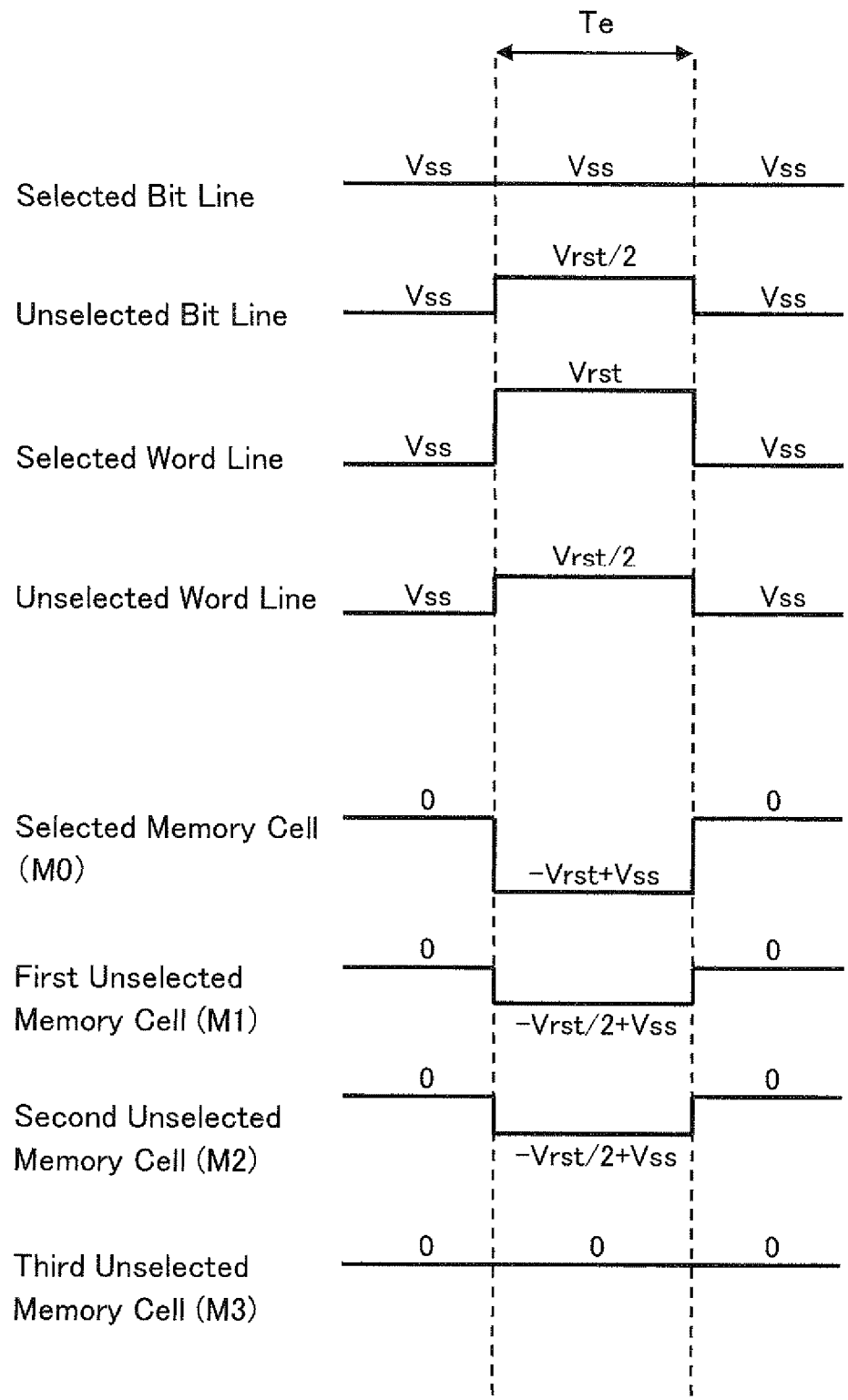
FIG. 5 shows an example of a voltage application procedure to a memory cell array during an erasing operation in the present invention.

First, FIG. 4 shows an example of a voltage application procedure to each part during a programming operation in the memory cell array 15a configured by the 1R type memory cells 14a. Similarly, FIG. 5 shows an example of a voltage application procedure during an erasing operation. In the following example, a specific example is described in which a programming operation or an erasing operation is performed to a memory cell M0 that is specified by the bit line BL2 and the word line WL3 in FIG. 2. As shown in FIG. 4, when programming data into the selected memory cell M0, a selected word line WLs connected to the selected memory cell M0 is maintained at the ground potential Vss, and during a programming period Tw, a program blocking voltage Vwrt/2 is applied to an unselected word line WLu and to an unselected bit line BLu, and a program voltage Vwrt is applied to a selected bit line BLs.

During the programming period Tw, a voltage difference Vw (=Vwrt−Vss) equal to or larger than a threshold value necessary for a programming operation occurs between the selected bit line BLs and the selected word line WLs, and a resistance state of a variable resistance element of a selected memory cell changes. At this time, a voltage of approximately a half of the program voltage Vwrt is applied, during the programming period Tw, to a variable resistance element of a first unselected memory cell M1 in FIG. 2 connected to the selected word line WLs and the unselected bit line BLu, and to a variable resistance element of a second unselected memory cell M2 in FIG. 2 connected to the selected bit line BLs and the unselected word line WLu. However, programming does not occur because Vwrt is set such that the voltage applied to the first unselected memory cell M1 and the second unselected memory cell M2 is set lower than a threshold voltage necessary for the programming operation.

On the other hand, when data is erased from the selected memory cell M0, a voltage having the polarity opposite to that in the programming is applied to the variable resistance element of the selected memory cell M0. As shown in FIG. 5, the selected bit line BLs connected to a selected memory cell is maintained at the ground potential Vss, and during an erasing period Te, an erasing blocking voltage Vrst/2 is applied to the unselected bit line BLu and the unselected word line WLu, and the erase voltage Vrst is applied to the selected word line WLs.

During the erasing period Te, a voltage difference Ve (Vss−Vrst) equal to or larger than a threshold value necessary for an erasing operation of a memory cell occurs between the selected bit line BLs and the selected word line WLs, and a resistance of a variable resistance element of a selected memory cell changes. At this time, a voltage of which an absolute value is approximately a half of the erase voltage Vrst is applied, during the erasing period Te, to a variable resistance element of the first unselected memory cell M1 in FIG. 2 connected to the selected word line WLs and the unselected bit line BLu, and to a variable resistance element of the second unselected memory cell M2 in FIG. 2 connected to the selected bit line BLs and the unselected word line WLu. However, data is not erased because Vrst is set such that the voltage applied to the first unselected memory cell M1 and the second unselected memory cell M2 is set lower than a threshold voltage necessary for the erasing operation.

Figure 6:
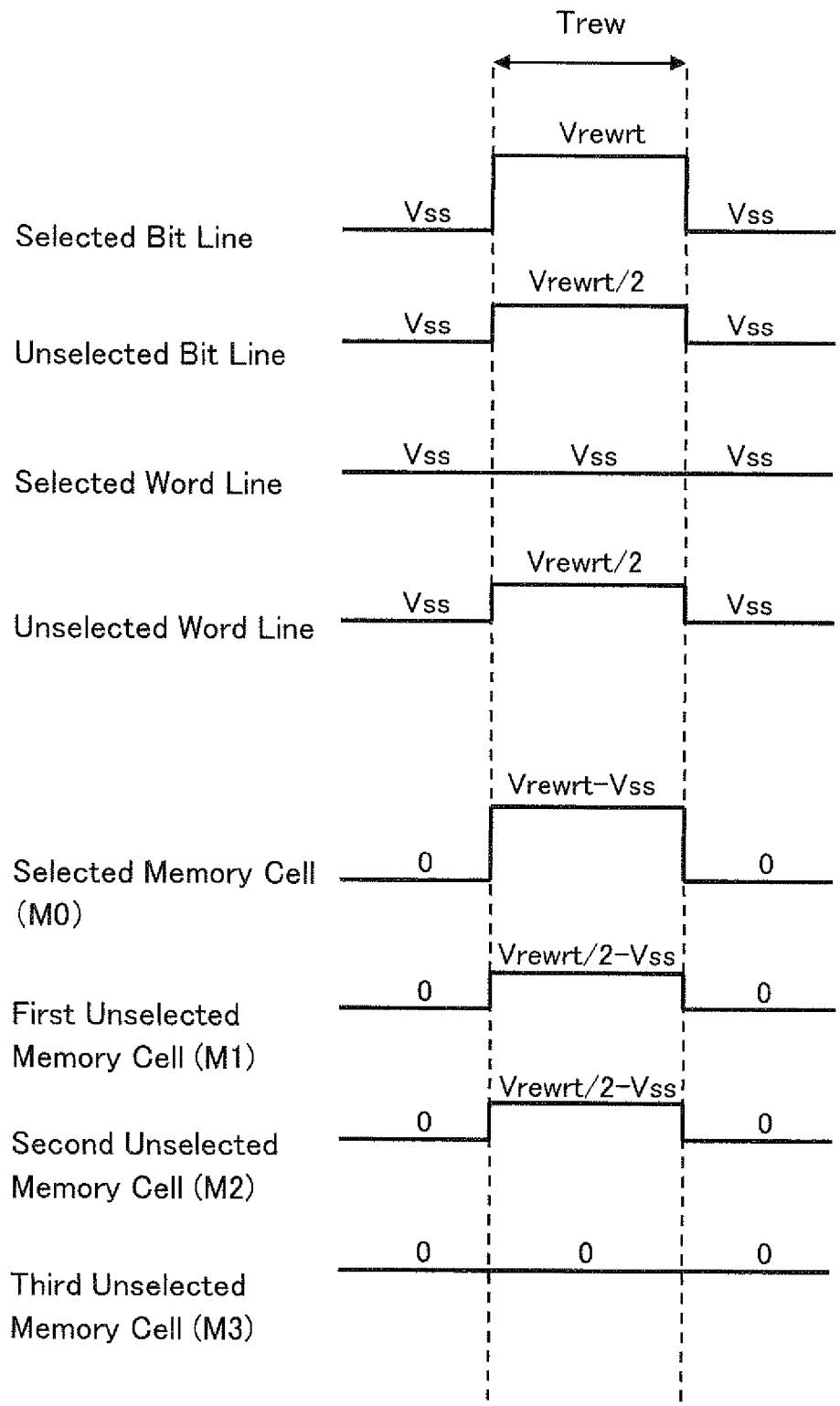
FIG. 6 shows an example of a voltage application procedure to a memory cell array during program reforming in the present invention.
Figure 7:
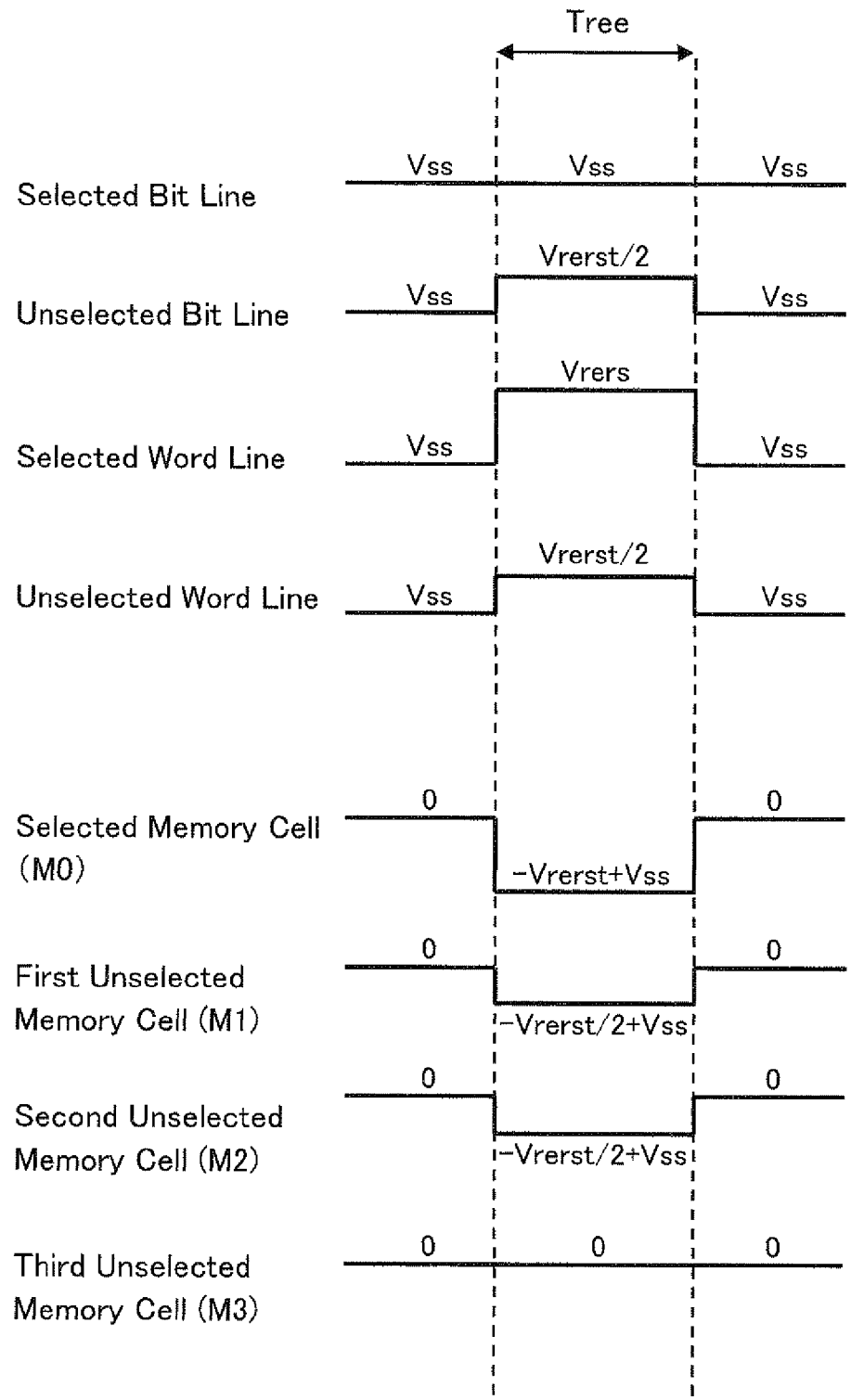
FIG. 7 shows an example of a voltage application procedure to a memory cell array during erase reforming in the present invention.

Next, FIG. 6 shows an example of a voltage application procedure to each part during the program reforming in the memory cell array 15a configured by the 1R type memory cells 14a. Similarly, FIG. 7 shows an example of a voltage application procedure to each part during erase reforming. In the following example, the bit line BL2 is selected, and all memory cells connected to the selected bit line are reformed, by sequentially selecting any one of the word lines WL1 to WLn and reforming each memory cell. Among others, specifically, a case of reforming the memory cell M0 specified by the bit line BL2 and the word line WL3 will be described as an example.

As shown in FIG. 6, when the program reforming is performed, a selected word line connected to a selected memory cell is maintained at the ground potential Vss, and during a program reforming period Trew, a program reforming voltage Vrewrt is applied to the selected bit lime BLs, and Vrewrt/2 is applied to the unselected word line WLu and the unselected bit line BLu respectively.

The program reforming period Trew is set longer than the period Tw during which a program voltage pulse is applied. Pulse rise/fall periods are provided before and after the voltage Vrewrt is applied, and a voltage amplitude of a pulse is preferably slowly changed to avoid a rapid voltage change.

During the program reforming period Trew, a voltage difference Vrew (=Vrewrt−Vss) equal to or larger than a threshold value necessary for a program reforming occurs between the selected bit line BLs and the selected word line WLs, and a program reforming voltage pulse is applied to a selected memory cell. At this time, a voltage approximately a half of the program reforming voltage Vrewrt is applied, during the program reforming period Trew, to the first unselected memory cell M1 in FIG. 2 connected to the selected word line WLs and the unselected bit line BLu, and to the second unselected memory cell M2 in FIG. 2 connected to the selected bit line BLs and the unselected word line WLu. However, reforming does not occur because Vrewrt is set such that the voltage applied to the first unselected memory cell M1 and the second unselected memory cell M2 is set lower than a threshold voltage necessary for the program reforming.

On the other hand, in the erase reforming, a voltage pulse having a polarity opposite to that in the program reforming is applied to a selected memory cell. As shown in FIG. 7, when the erase reforming is performed, the selected bit line BLs connected to a selected memory cell is maintained at the ground potential Vss, and during an erase reforming period Tree, the erase reforming voltage Vrerst is applied to the selected word line WLs, and Vrerst/2 is applied to the unselected word line WLu and the unselected bit line BLu respectively.

The erase reforming period Tree is set longer than the period Te during which an erase voltage pulse is applied. Pulse rise/fall periods are provided before and after the voltage Vrerst is applied, and a voltage amplitude of a pulse is preferably slowly changed to avoid a rapid voltage change.

During the erase reforming period Tree, a voltage difference Vree (=Vss−Vrerst) equal to or larger than a threshold value necessary for the erase reforming of a memory cell occurs between the selected bit line BLs and the selected word line WLs, and an erase reforming voltage pulse is applied to a selected memory cell. At this time, a voltage of which an absolute value is approximately a half of the erase reforming voltage Vrerst is applied, during the erase reforming period Tree, to the first unselected memory cell M1 in FIG. 2 connected to the selected word line WLs and the unselected bit line BLu, and to the second unselected memory cell M2 in FIG. 2 connected to the selected bit line BLs and the unselected word line WLu. However, reforming does not occur because Vrerst is set such that the voltage applied to the first unselected memory cell M1 and the second unselected memory cell M2 is set lower than a threshold voltage necessary for the erase reforming.

Although the reforming operation method described above is an example of a case of performing reforming to each memory cell by selecting the word lines one by one, it is also possible to simultaneously perform reforming to a plurality of memory cells connected to selected bit lines by simultaneously selecting a plurality of word lines, and to simultaneously perform reforming to all memory cells connected to selected bit lines by selecting all word lines in a memory cell array. In this case, because the unselected word line WLu is not present, the second unselected memory cell M2 in FIG. 2 is not present either. In the above-described example, a potential of a word line at a connection point with a memory cell increases (decreases) due to an influence of a wiring resistance and the like of the word line. Therefore, Vrewrt/2 (Vrerst/2) is also applied to the unselected bit line BLu to prevent application of a program reforming voltage (erase reforming voltage) to the first unselected memory cell M1 connected to the unselected bit line BLu. However, application of this voltage is not necessary when the influence of the wiring resistance of the word line and the bit line can be ignored. That is, when the influence of the wiring resistance of the word line and the bit line can be ignored, a program reforming operation may be performed by applying Vrewrt to the selected bit line and by applying Vss to the unselected bit lines and the word lines. Alternatively, an erase reforming operation may be performed by applying Vss to a selected bit line and applying Vrerst to the unselected bit lines and the word lines.

Figure 8:
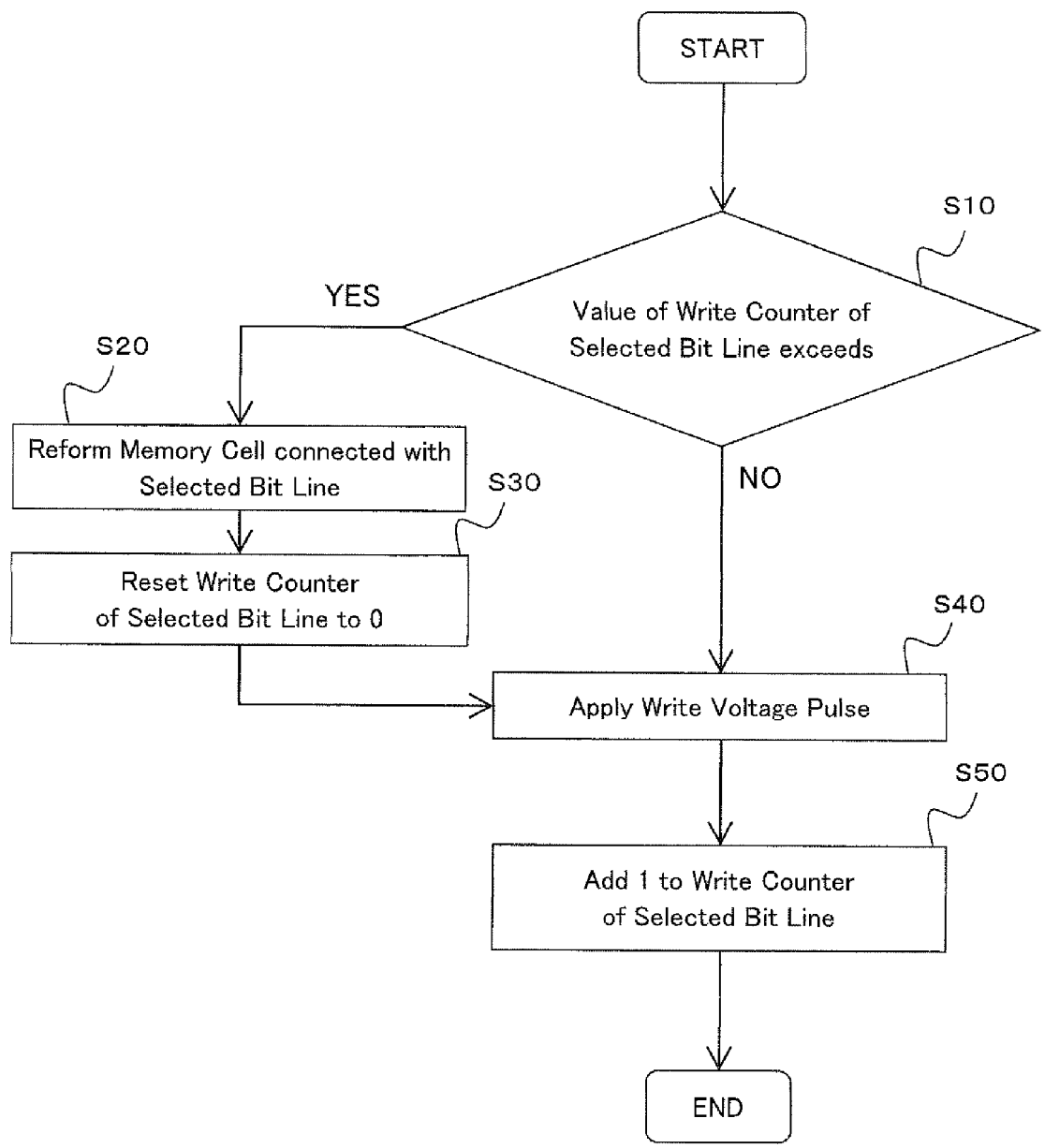
FIG. 8 is an operation flow chart during programming or erasing in the present invention.

FIG. 8 shows a flowchart of a programming operation and an erasing operation of the present invention device 1. In a programming or erasing operation of a selected memory cell in the memory cell array 15, the control circuit 20 first reads the number of times of application of a write voltage pulse to a selected bit line held in the write counter 30, and determines whether this number exceeds a predetermined first set value (10000, for example) (step S10).

As a result, when the number of times of writing is larger than the first predetermined value, the control circuit 20 performs a reforming operation to all memory cells connected to the selected bit line (step S20). That is, the control circuit 20 applies one of a program reforming voltage pulse and an erase reforming voltage pulse for one time, or both pulses alternately for one time or for a plurality of times, to all the memory cells connected to the selected bit line, regardless of a resistance state of a variable resistance element of each memory cell.

When the reforming operation is completed, the control circuit 20 resets a count value of the selected bit line held in the write counter 30 to zero (step S30).

Thereafter, the control circuit 20 controls the bit line decoder 16, the word line decoder 17, and the write voltage application circuit 22a to apply a write voltage pulse to the selected memory cell, and program or erase data to and from this cell (step S40). At this time, a voltage to be applied from the write voltage application circuit 22a to each bit line via the bit line decoder 16 and a voltage to be applied from the write voltage application circuit 22a to each word line via the word line decoder 17 are set as shown in FIG. 4 and FIG. 5, respectively.

After the application of the write voltage pulse is completed, the control circuit 20 adds 1 to a numerical value of the number of times of writing to the selected bit line in the write counter 30 (step S50), and ends the programming operation or the erasing operation.

Figure 9:
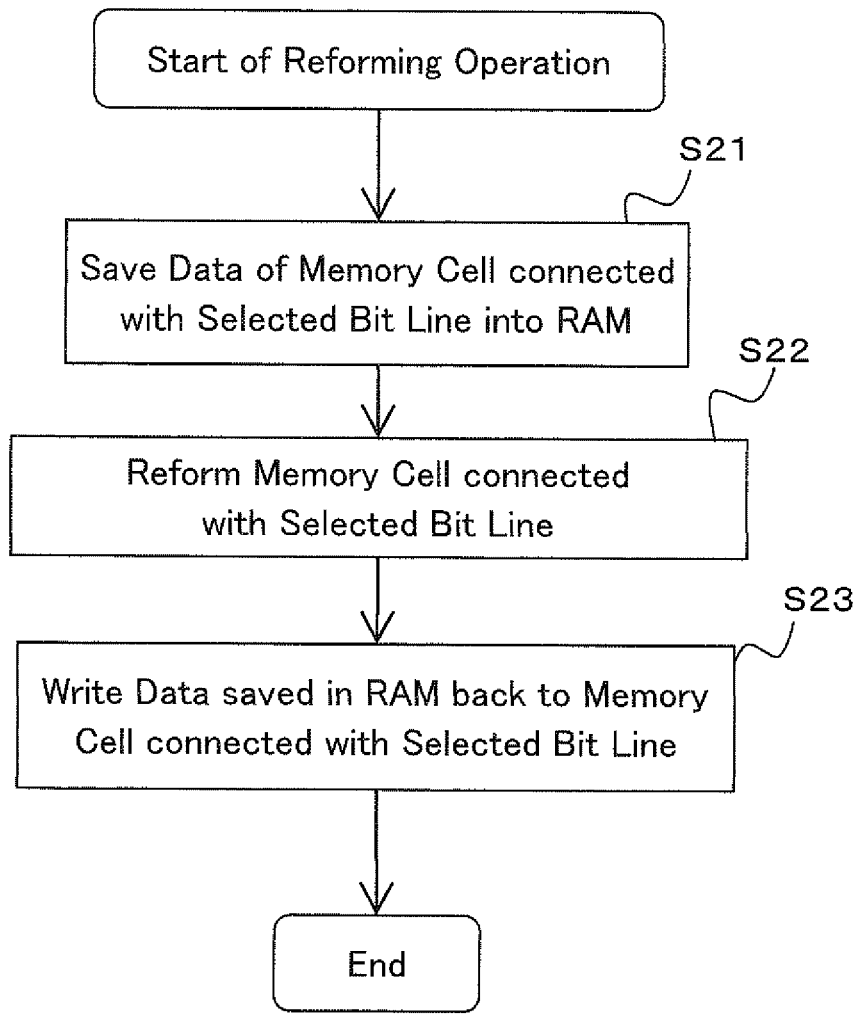
FIG. 9 is an operation flow chart during reforming in the present invention.

FIG. 9 shows a detailed flow diagram of the reforming operation in step S20 of FIG. 8. Before applying a reforming voltage pulse, the control circuit 20 reads all data in the memory cells 14 connected to a selected bit line to be reformed, by using the reading circuit 23, and saves the read data into a volatile memory (a RAM in the write counter 30, for example) (step S21).

Thereafter, the control circuit 20 performs the reforming operation to all the memory cells connected to a selected bit line (step S22). That is, the control circuit 20 controls the bit line decoder 16, the word line decoder 17, and the reforming voltage application circuit 22b such that a reforming voltage pulse is applied to all the memory cells connected to the selected bit line and the reforming is performed. At this time, a voltage to be applied from the reforming voltage application circuit 22b to each bit line via the bit line decoder 16 and a voltage to be applied from the reforming voltage application circuit 22b to each word line via the word line decoder 17 are set as shown in FIG. 6 and FIG. 7, respectively.

In this case, the reforming voltage pulse may be applied such that the program reforming voltage pulse and the erase reforming voltage pulse are alternately applied by a plurality of cycles or by only one cycle. Alternatively, either one of the program reforming voltage pulse and the erase reforming voltage pulse may be applied only once.

Thereafter, the data saved in the volatile memory are written back to the memory cells 14 connected to the selected bit line (step S23).

The present invention device 1 that includes the write counter 30 can recover a switching characteristic of a variable resistance element by applying a reforming voltage pulse to a memory cell that includes the variable resistance element of which the switching characteristic is degraded and a read margin is small as a result of applying a program voltage pulse for the number of times equal to or larger than a first set value. Accordingly, a variation of a resistance value of stored data due to a large number of times of switching operations can be decreased, and a stable writing operation can be performed.

The programming, erasing, and reforming operations can be performed by replacing a relationship between the bit lines and the word lines. The programming and erasing operations can be performed to a plurality of memory cells in the memory cell array, by increasing the number of selected bit lines or by increasing the number of selected word lines. In this case, a voltage application condition is similar to that when the programming is performed to a single memory cell.

Second Embodiment

Figure 10:
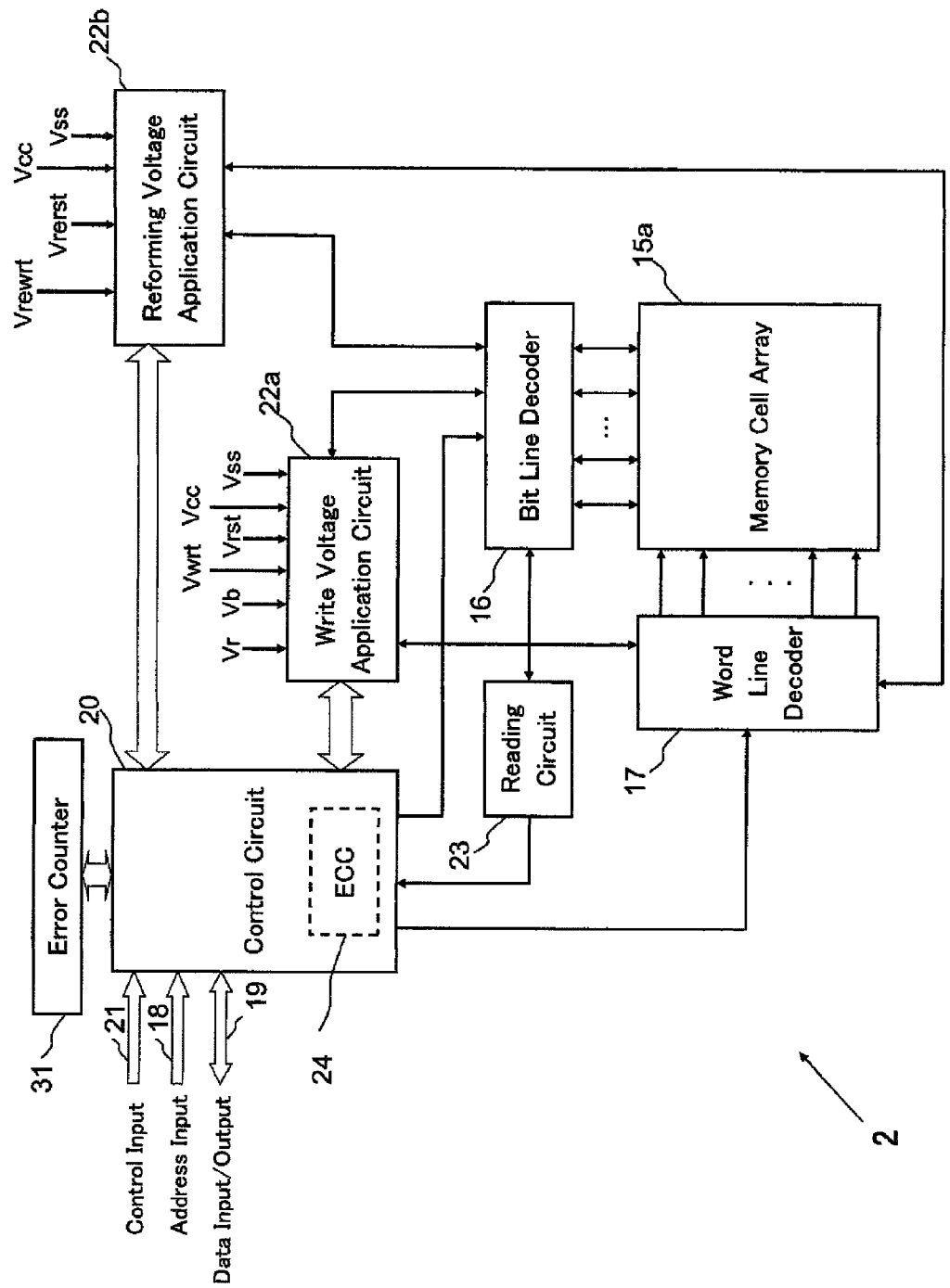
FIG. 10 is a circuit block diagram showing a configuration example of a semiconductor memory device according to a second embodiment of the present invention.

FIG. 10 shows a configuration example of a semiconductor memory device (hereinafter appropriately referred to as "present invention device 2") according to an embodiment of the present invention. In FIG. 10, a portion that is common to that of the conventional semiconductor memory device or the present invention device 1 in FIG. 1 is denoted with a common reference symbol.

As shown in FIG. 10, the present invention device 2 includes the bit line decoder 16, the word line decoder 17, the control circuit 20, the write voltage application circuit 22a, the reforming voltage application circuit 22b, the reading circuit 23, and an error counter 31, around the memory cell array 15a having 1R type memory cells (see reference symbol 14a in FIG. 2) arranged in a matrix shape. The present invention device 2 is different from the present invention device 1 shown in FIG. 1 in that the present invention device 2 includes, in place of the write counter 30, the error counter 31 that stores the number of times of error correction in a reading operation for each bit line or for each word line, and that a reforming voltage pulse from the reforming voltage application circuit 22b is applied to a bit line or a word line in which the number of times of error correction exceeds a predetermined value.

The control circuit 20 internally includes an ECC (Error-Correcting Code) circuit 24, and has a function of correcting an error generated during writing, in addition to a function of controlling each operation of programming, erasing, reading, and reforming the memory cell array 15a. The ECC circuit 24 can be separately provided instead of being built in the control circuit 20. The ECC circuit 24 detects whether read data has an error, and corrects the data if an error exists, during a reading operation (including a verification operation after applying the program or erase voltage pulse).

Figure 28A:
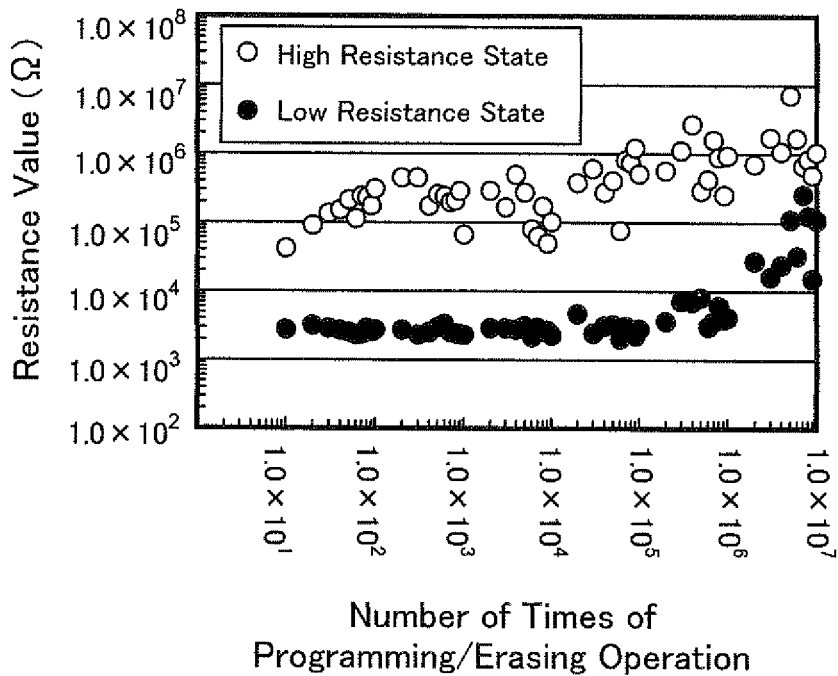
FIGS. 28A and 28B show changes in switching characteristic before and after reforming is performed as an effect of the present invention.
Figure 28B:
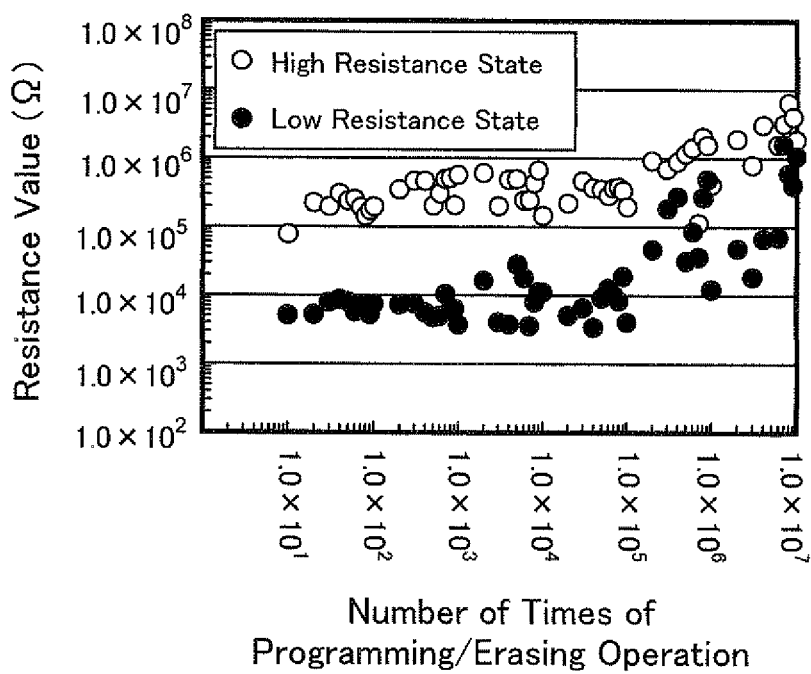
Figure 29A:
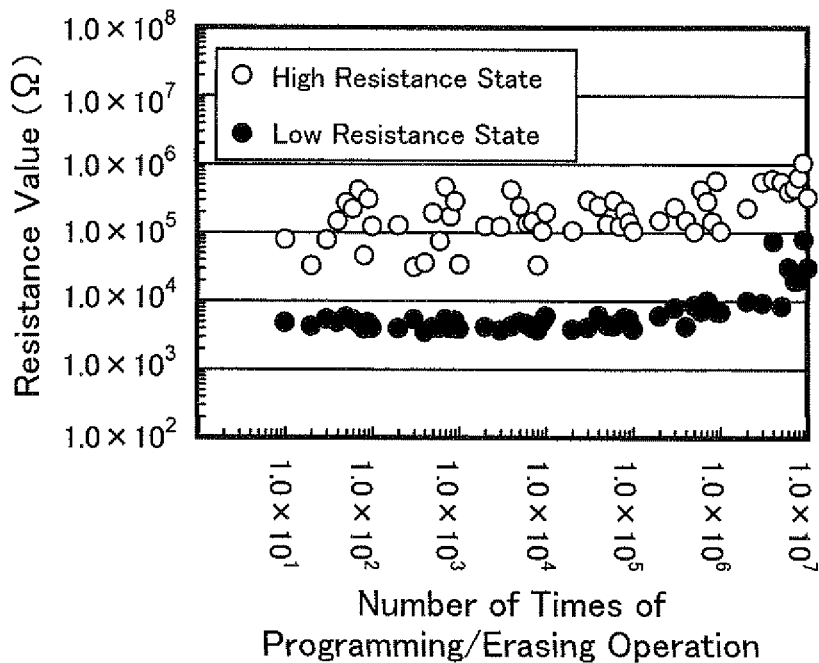
FIGS. 29A and 29B show changes in switching characteristic before and after reforming is performed as an effect of the present invention.
Figure 29B:
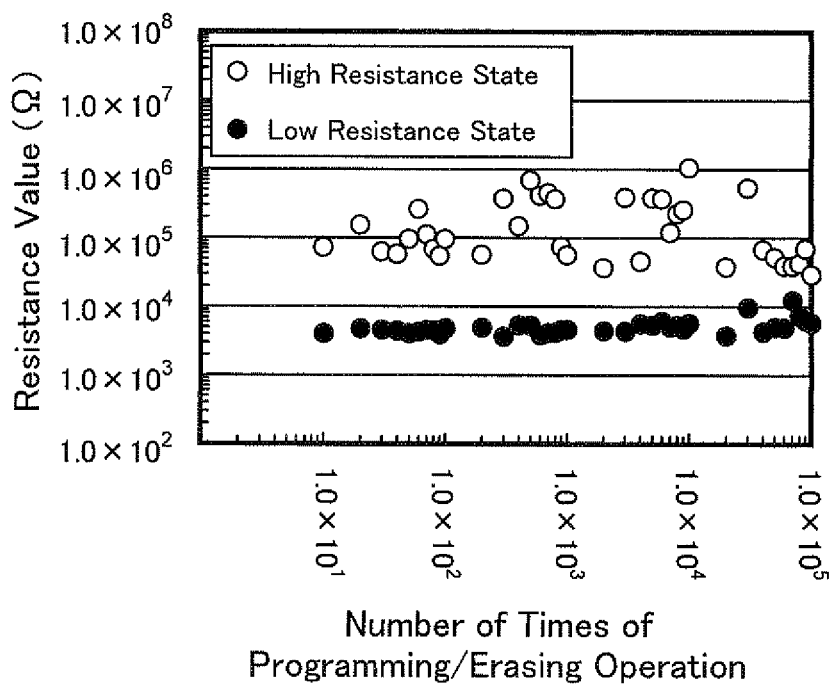
Figure 31:
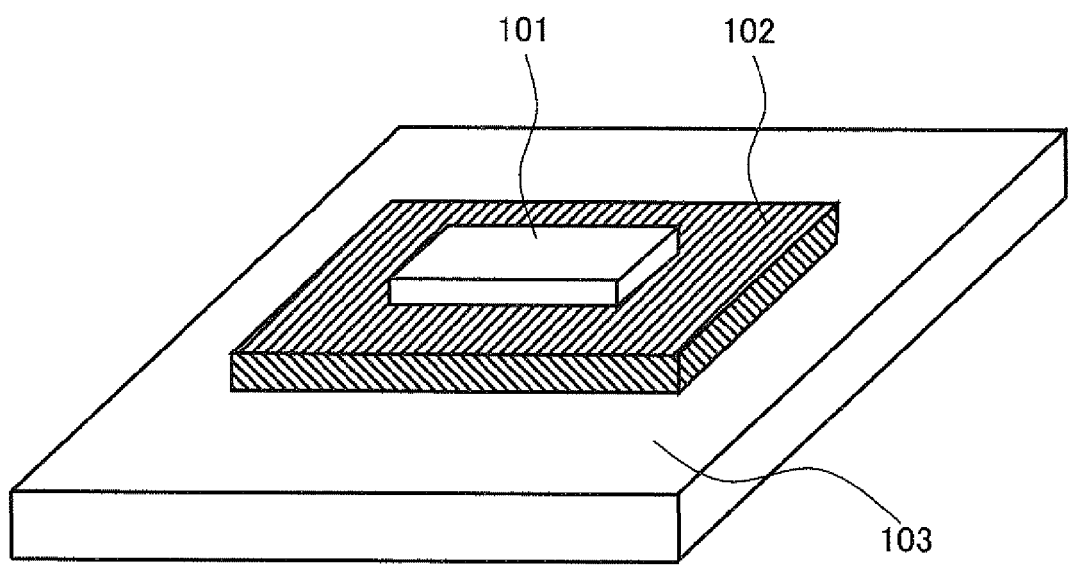
FIG. 31 is a configuration diagram showing an example of a variable resistance element that is used to store information in the present invention.
Figure 32:
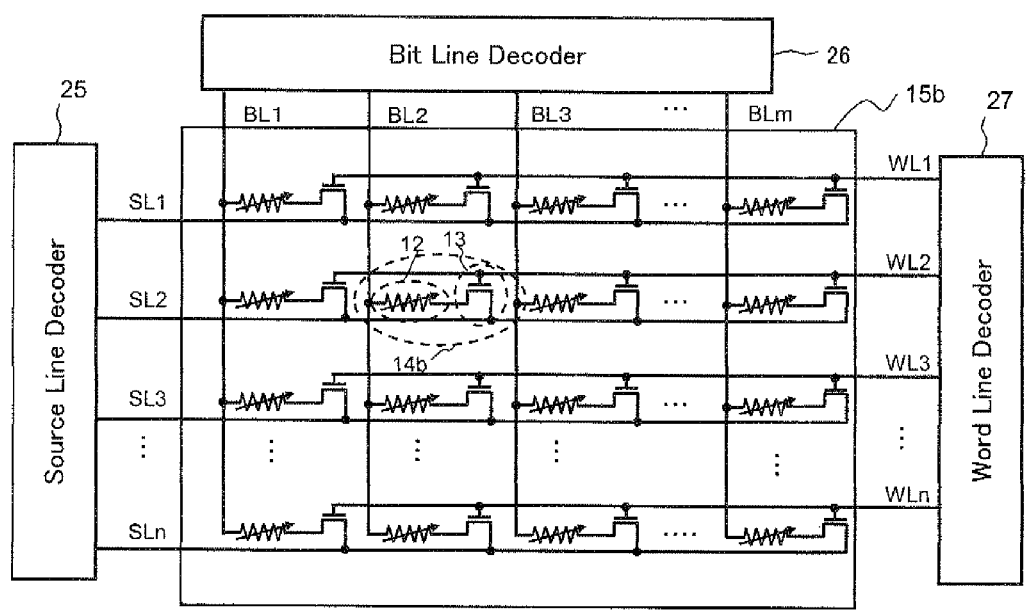
FIG. 32 shows a circuit configuration of a memory cell array of a conventional configuration that includes 1T1R type memory cells.
Figure 33:
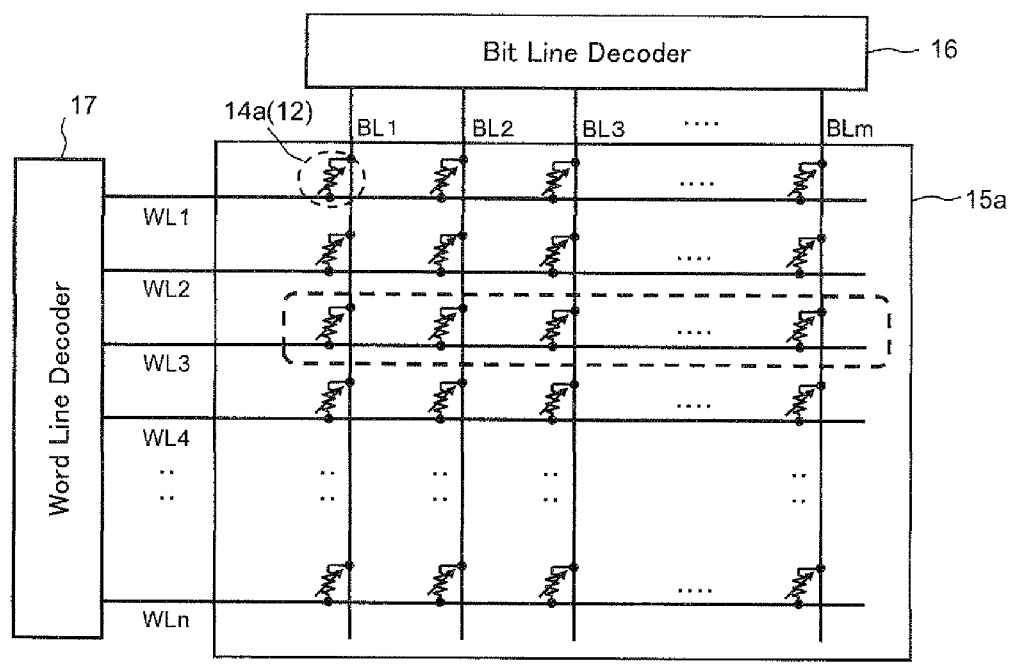
FIG. 33 shows a circuit configuration of a memory cell array of a conventional configuration that includes 1R type memory cells.
Figure 34:
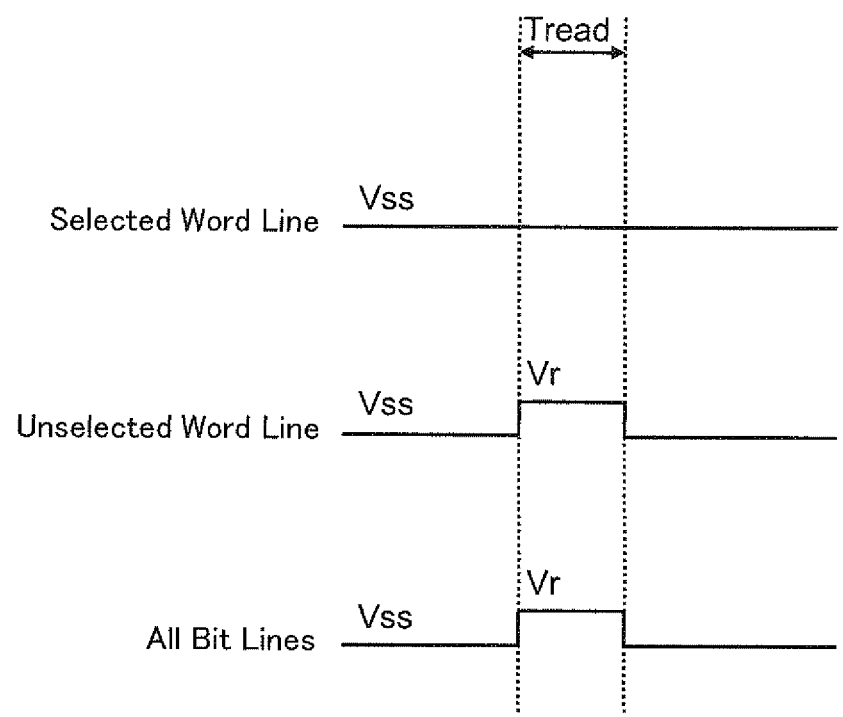
FIG. 34 shows an example of a voltage application procedure to a memory cell array during a reading operation in the memory cell array of the conventional configuration that includes 1R type memory cells.
Figure 35:
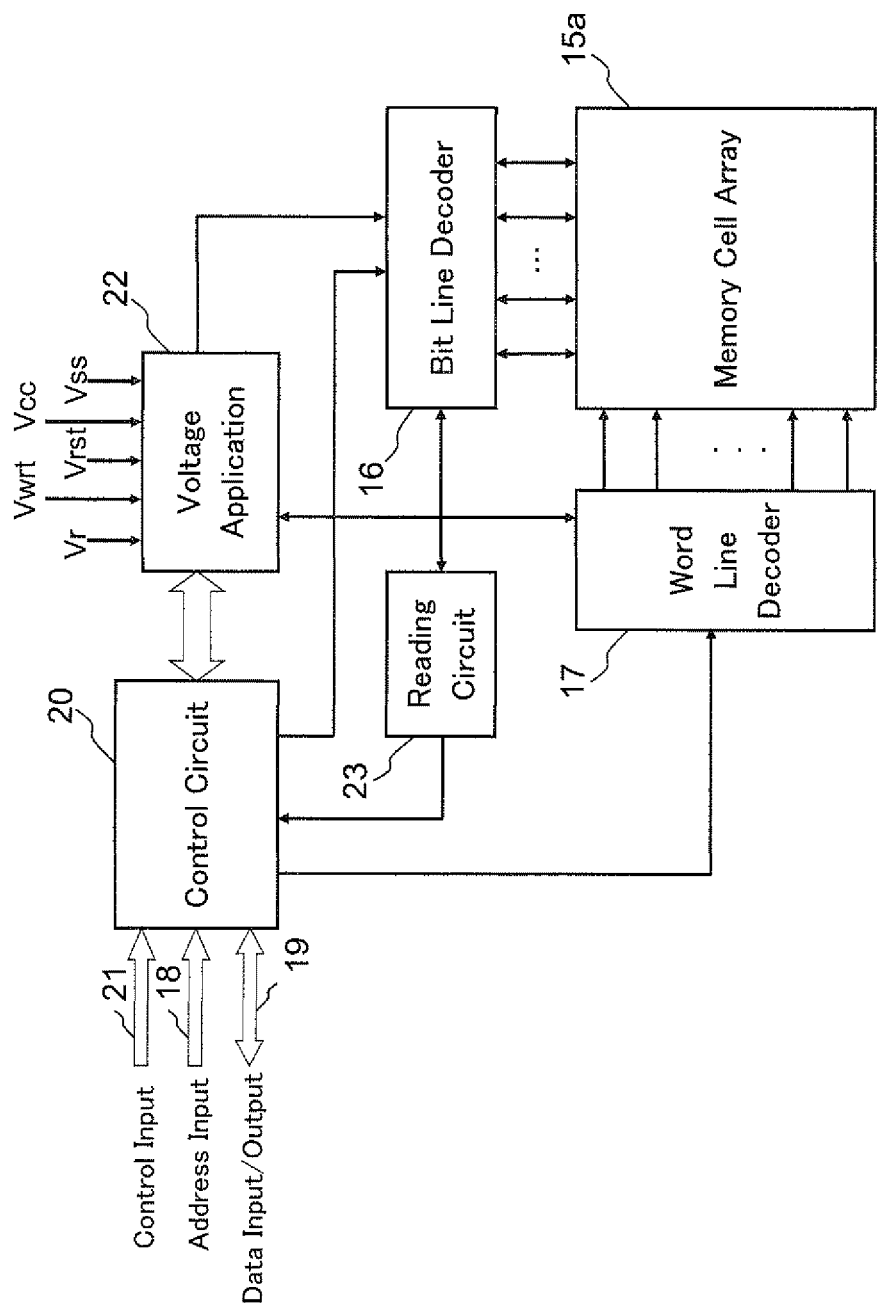
FIG. 35 shows an example of a circuit block diagram of the semiconductor memory device of the conventional configuration that includes 1R type memory cells.

More specifically, the control circuit 20 determines whether a current voltage characteristic of a variable resistance element of a selected memory cell detected based on a read voltage pulse applied to a selected bit line and an amount of current flowing through a selected word line is within a predetermined first set range. Here, the first set range is either a range of a current voltage characteristic of a variable resistance element that the reading circuit 23 can read the resistance state of the variable resistance element as being in an erase state after application of the erase voltage pulse, or a range of a current voltage characteristic of a variable resistance element that the reading circuit 23 can read the resistance state of the variable resistance element as being in a program state after application of the program voltage pulse. That is, the first set range is a range of a current voltage characteristic of a variable resistance element that the reading circuit 23 can read the resistance state of the variable resistance element as being in a resistance state to which the resistance state of the variable resistance element is to transition by the write voltage pulse applied immediately before. For example, in FIGS. 28A and 28B, a range of a resistance value from 1 KΩ, to 10 kΩ can be the first set range in a low resistance state, and a range of a resistance value from 20 kΩ, to 1 MΩ can be the first set range in a high resistance state.

Therefore, the current voltage characteristic being outside a first set range means that data to be programmed is not programmed, or that data to be erased is not erased. In the present embodiment, the ECC circuit 24 determines whether a current voltage characteristic of a variable resistance element of a memory cell is within the first set range, based on presence of a data error, and corrects the data when there is a data error.

The error counter 31 has an initial count value of 0, and 1 is added to the count value of the selected bit line connected to the selected memory cell, each time when it is determined that the current voltage characteristic of the selected memory cell is not within the first set range. When a count value of a certain bit line reaches a predetermined second set value, a reforming voltage pulse is applied from the reforming voltage application circuit 22b to a memory cell connected to the target bit line.

The error counter 31 can store the number of times of data correction of a word line, instead of storing the number of times of data correction of a bit line by the ECC circuit 24.

Figure 11:
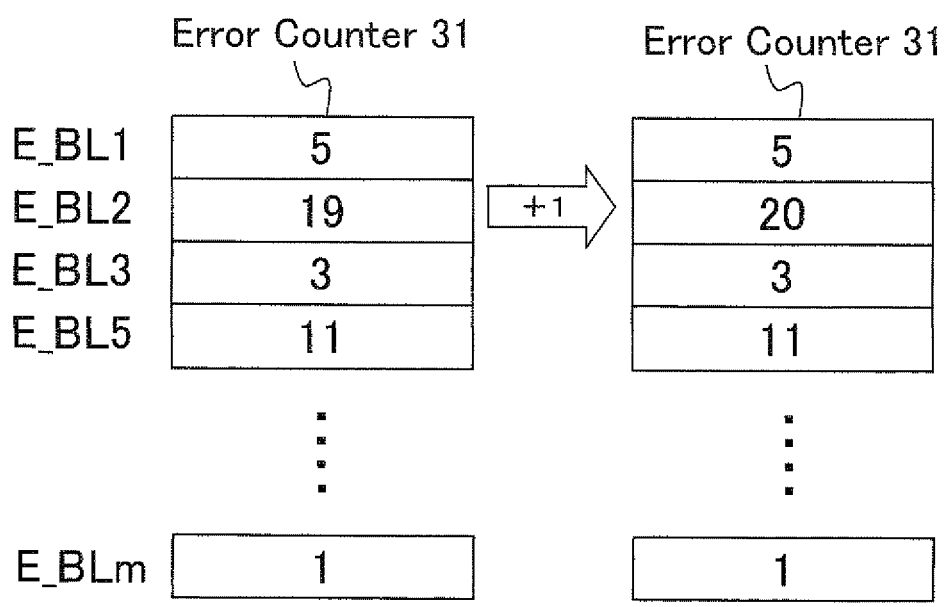
FIG. 11 is a conceptual diagram showing a configuration example of an error counter.

FIG. 11 is a conceptual diagram showing a configuration of the error counter 31. In the present embodiment, the error counter 30 is provided for each bit line of the memory cell array, and stores a total number of times of data correction by the ECC circuit 24 for each memory cell belonging to the same column. For example, when the ECC circuit 24 corrects data of the memory cell connected to the bit line BL2, the error counter 31 adds 1 to the number of times of data correction in E_BL2, and stores the resultant value in the error counter 31 as the number of times of data correction to BL2.

A voltage application method for selecting the bit line and the word line of the memory cell array 15 in the programming, erasing, and reforming operations in the present embodiment is similar to that in the first embodiment described with reference to FIGS. 4 to 7, and therefore, a description thereof will not be given.

Figure 12:
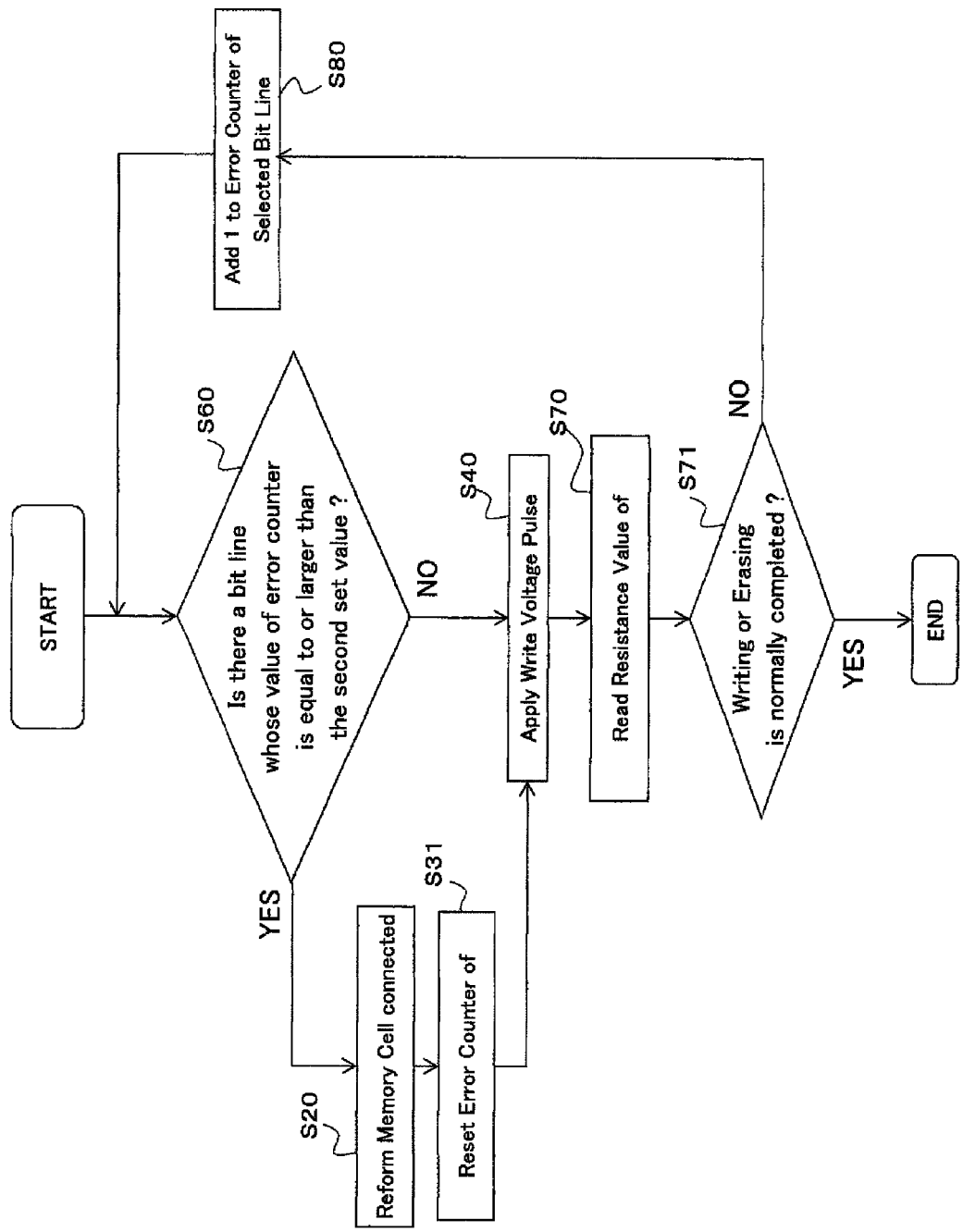
FIG. 12 shows another example of an operation flowchart during programming or erasing in the present invention.

FIG. 12 is a flowchart showing programming and erasing operations of the present invention device 2. In the programming or erasing operation of the selected memory cell in the memory cell array 15, the control circuit 20 first reads the number of times of data correction of the selected bit line held in the error counter 31, and determines whether this number reaches the predetermined second set value (20, for example) (step S60).

As a result, when the number of times of data correction reaches the second set value, the control circuit 20 performs a reforming operation to all memory cells connected to the selected bit line (step S20). The reforming operation is similar to that described with reference to FIG. 9 in the first embodiment.

When the reforming operation is completed, the count value of the selected bit line held in the error counter 31 is reset to zero (step S31).

In step S40, the control circuit 20 controls the bit line decoder 16, the word line decoder 17, and the write voltage application circuit 22a to apply the write voltage pulse to the selected memory cell, and to program or erase data into or from this cell.

Thereafter, the control circuit 20 reads the resistance state stored in the variable resistance element of the selected memory cell (step S70), and determines whether the data of the selected memory cell is correctly written (step S71). More specifically, the control circuit 20 determines whether the current voltage characteristic of the variable resistance element of the selected memory cell detected based on the read voltage pulse applied to the selected bit line and the amount of current flowing through the selected word line is within the first set range.

As described above, the current voltage characteristic being outside the first set range means that the data writing in the selected memory cell has been unsuccessful. When the data of the selected memory cell is not correctly written, the control circuit 20 adds 1 to the count value of the selected bit line held in the error counter 31 (step S80), returns to step S60, and performs the programming or erasing operation again.

The present invention device 2 that includes the error counter 31 can detect, based on the number of times of data correction by the ECC circuit 24, the presence of a memory cell that includes a variable resistance element of which a switching characteristic is degraded and a read margin is small as a result of applying a program voltage pulse for a large number of times. The present invention device 2 can also recover the switching characteristic of the variable resistance element, by applying a reforming voltage pulse to a memory cell of which the number of times of data correction exceeds the second set value. Accordingly, a variation of a resistance value of stored data due to a large number of times of switching operations can be decreased, and a stable writing operation can be performed.

The present embodiment that includes the error counter 31 can be performed by combining the configuration of the first embodiment that includes the write counter 30.

Third Embodiment

Figure 13:
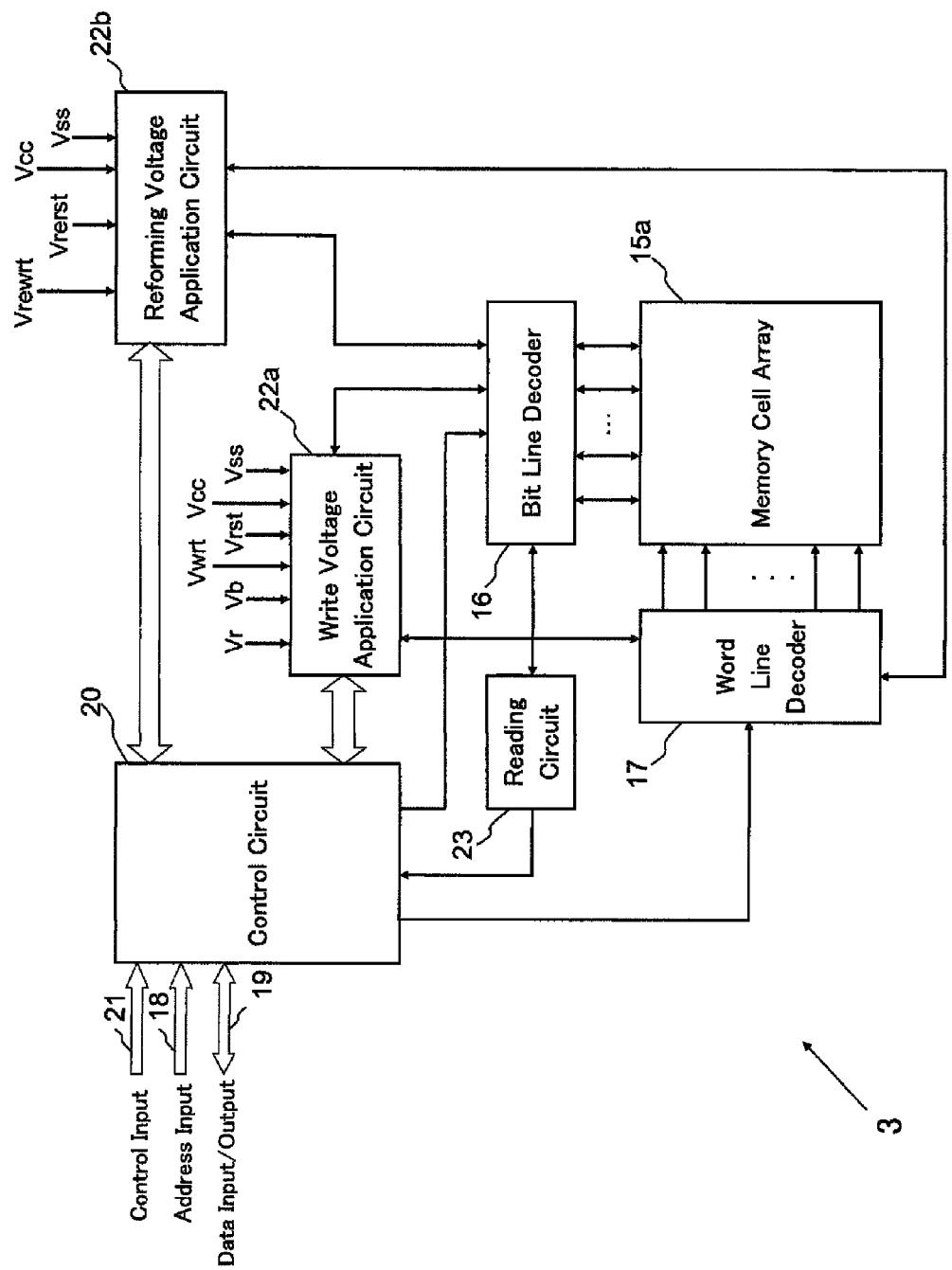
FIG. 13 is a circuit block diagram showing a configuration example of a semiconductor memory device according to a third embodiment of the present invention.

FIG. 13 shows a configuration example of a semiconductor memory device (hereinafter, appropriately referred to as "present invention device 3") according to an embodiment of the present invention. In FIG. 13, a portion that is common to that of the conventional semiconductor memory device or the present invention device 1 in FIG. 1 is denoted with a common reference symbol.

As shown in FIG. 13, the present invention device 3 includes the bit line decoder 16, the word line decoder 17, the control circuit 20, the write voltage application circuit 22a, the reforming voltage application circuit 22b, and the reading circuit 23, around the memory cell array 15a having 1R type memory cells (see reference symbol 14a in FIG. 2) arranged in a matrix shape. In the present embodiment, the present invention device 3 is different from the present invention device 1 shown in FIG. 1 and the present invention device 2 shown in FIG. 10 in that it does not include a counter that determines the necessity of reforming. Instead, the present invention device 3 is configured such that the reading circuit 23 detects a current flowing through the selected bit line when the program voltage pulse or the erase voltage pulse is applied, and the reforming voltage pulse is applied from the reforming voltage application circuit 22b when the amount of current detected by the reading circuit 23 is outside the set range even once.

In the programming or erasing operation, the reading circuit 23 is electrically connected in series with the selected bit line. A change of the current voltage characteristic of the selected memory cell can be known based on the current flowing through the reading circuit when the program voltage pulse or the erase voltage pulse is applied. The control circuit 20 applies the reforming voltage pulse from the reforming voltage application circuit 22b when the amount of current detected by the reading circuit 23 is outside the second set range.

Here, the second set range is a range of current flowing through the variable resistance element by applying a write voltage pulse when data of the selected memory cell is correctly written by applying the write voltage pulse and also when the resistance state of the variable resistance element after the writing can be correctly read.

The voltage application method for selecting the bit line and the word line of the memory cell array 15a in the programming, erasing, and reforming operations in the present embodiment is similar to the configuration of the first embodiment described with reference to FIGS. 4 to 7, and therefore, a description thereof will not be given.

Figure 14:
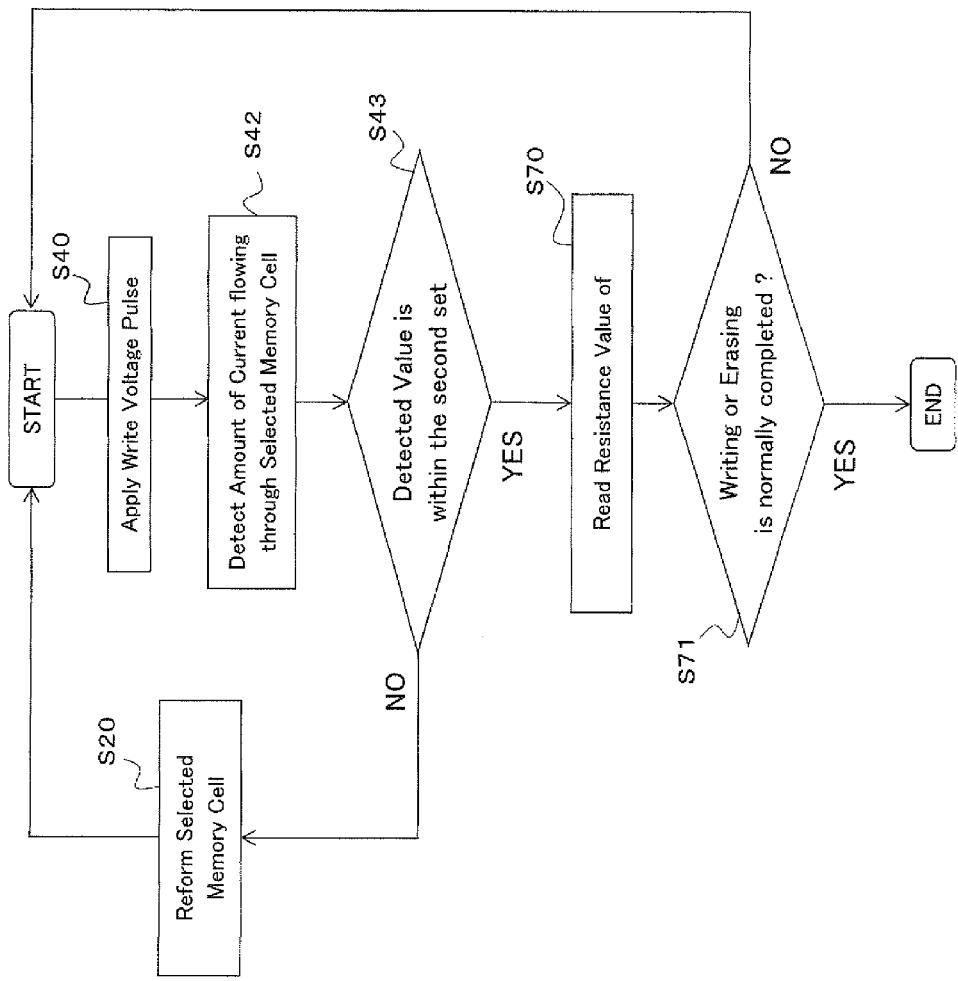
FIG. 14 shows another example of an operation flowchart during programming or erasing in the present invention.

FIG. 14 is a flowchart showing programming and erasing operations of the present invention device 3. In the programming or erasing operation of the selected memory cell in the memory cell array 15a, the control circuit 20 controls the bit line decoder 16, the word line decoder 17, and the write voltage application circuit 22a to apply a write voltage pulse to the selected memory cell (step S40). At the same time, the reading circuit 23 detects a current flowing through the selected memory cell when a programming pulse is applied (step S42), and determines whether the amount of current is within the second set range (step S43).

As a result, when the amount of current detected by the reading circuit 23 is not within the second set range, the control circuit 20 performs a reforming operation to the selected memory cell (step S20). The reforming operation is similar to that described in the first embodiment with reference to FIG. 9. Then, returning back to step S40, a write voltage pulse is applied again.

On the other hand, when the amount of current detected by the reading circuit 23 is within the second set range, the control circuit 20 reads a resistance state stored in the variable resistance element of the selected memory cell (step S70), and determines whether the data of the selected memory cell is correctly written (step S71). When the data of the selected memory cell is not correctly written, the process returns to step S40 to apply the write voltage pulse again, and the control circuit 20 applies the write voltage pulse again.

Figure 15:
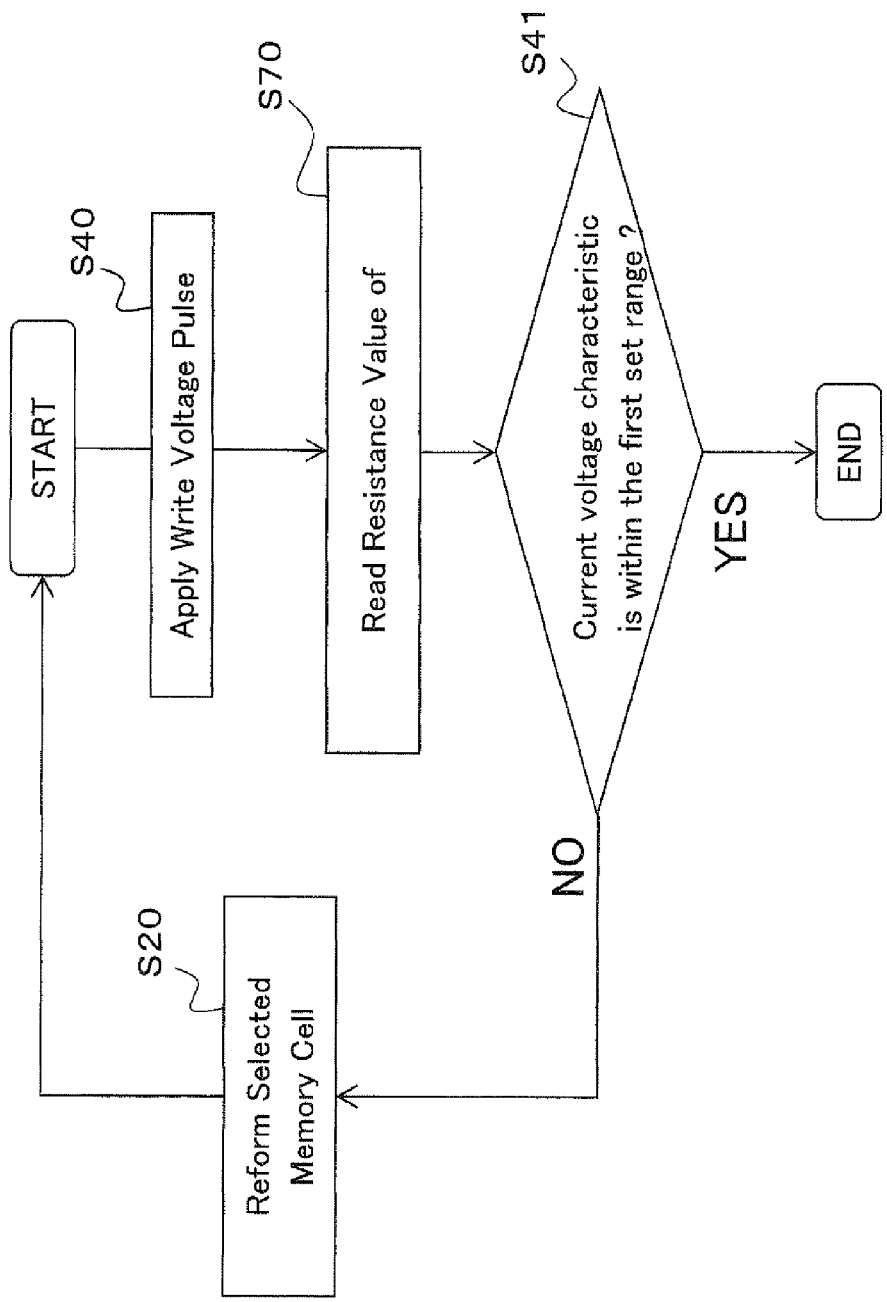
FIG. 15 shows another example of an operation flowchart during programming or erasing in the present invention.

Although the present invention device 3 detects the amount of current flowing through the variable resistance element of the selected memory cell by applying the write voltage pulse and determines whether reforming is necessary based on whether the amount of current is within the second set range, the present invention device 3 may also determine whether reforming is necessary based on whether the data of the selected memory cell is correctly written, by performing a read verification operation (step S70 in FIG. 14). FIG. 15 shows another flowchart showing programming and erasing operations of the present invention device 3. In the operation flowchart shown in FIG. 15, in step S41, the control circuit 20 determines whether the current voltage characteristic of the variable resistance element of the selected memory cell is within the first set range, and performs the reforming operation when the current voltage characteristic is within the first set range.

The present invention device 3 can recover the switching characteristic of the variable resistance element, by applying a reforming voltage pulse to the memory cell that includes the variable resistance element to which the writing has been unsuccessful due to the degraded switching characteristic because of a large number of times of application of the program voltage pulse. Accordingly, a variation of a resistance value of stored data can be decreased, and a stable writing operation can be performed.

The present embodiment can be performed by combining with the configuration of the first embodiment that includes the write counter 30 or the configuration of the second embodiment that includes the error counter 31.

Fourth Embodiment

Figure 16:
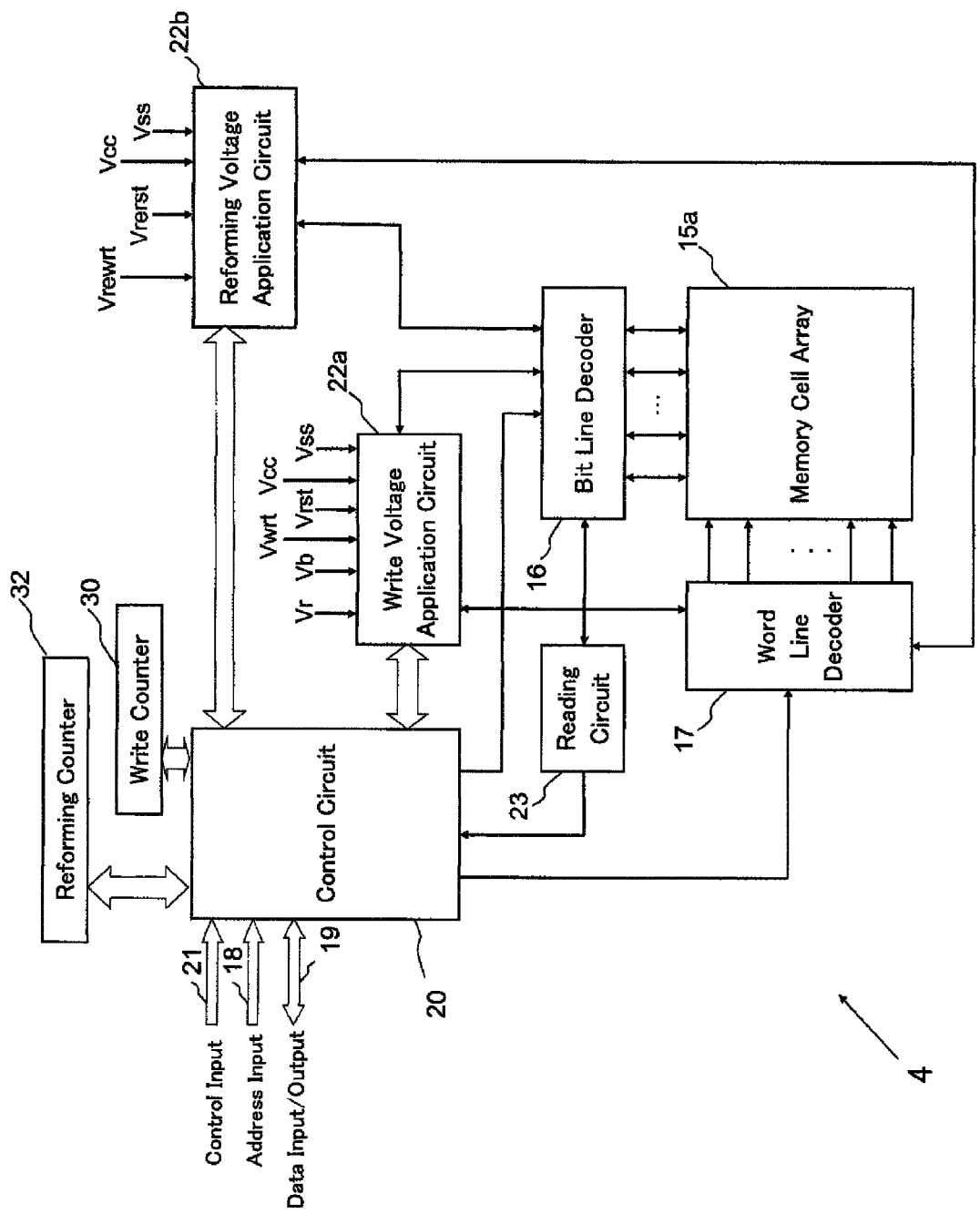
FIG. 16 is a circuit block diagram showing a configuration example of a semiconductor memory device according to a fourth embodiment of the present invention.

FIG. 16 shows a configuration example of a semiconductor memory device (hereinafter, appropriately referred to as "present invention device 4") according to an embodiment of the present invention. In FIG. 16, a portion that is common to that of the conventional semiconductor memory device or the present invention device 1 in FIG. 1 is denoted with a common reference symbol.

As shown in FIG. 16, the present invention device 4 includes the bit line decoder 16, the word line decoder 17, the control circuit 20, the write voltage application circuit 22a, the reforming voltage application circuit 22b, the reading circuit 23, the write counter 30, and a reforming counter 32, around the memory cell array 15a having 1R type memory cells (see reference symbol 14a in FIG. 2) arranged in a matrix shape. The present invention device 4 is configured to further include the reforming counter 32 that stores the number of times of reforming operation in the present invention device 1 shown in FIG. 1.

The reforming counter 32 holds the number of times of application of the reforming voltage pulse applied by the reforming voltage application circuit 22b, for each bit line or each word line, or for each sub-memory cell array of the memory cell array 15a. The present invention device 4 is configured to perform a reforming process in a sub-memory cell array unit to which a memory cell connected to a certain selected bit line belongs, or in a memory cell array unit, when the count value of the reforming counter 32 belonging to the selected bit line reaches the predetermined third set value, regardless of the value of the write counter 30. That is, the reforming process is performed in a range that is the same as or larger than the memory cell area related to the reforming counter.

A voltage application method for selecting the bit line and the word line of the memory cell array 15a in the programming, erasing, and reforming operations in the present embodiment is similar to the configuration in the first embodiment described with reference to FIGS. 4 to 7, and therefore, a description thereof will not be given.

Figure 17:
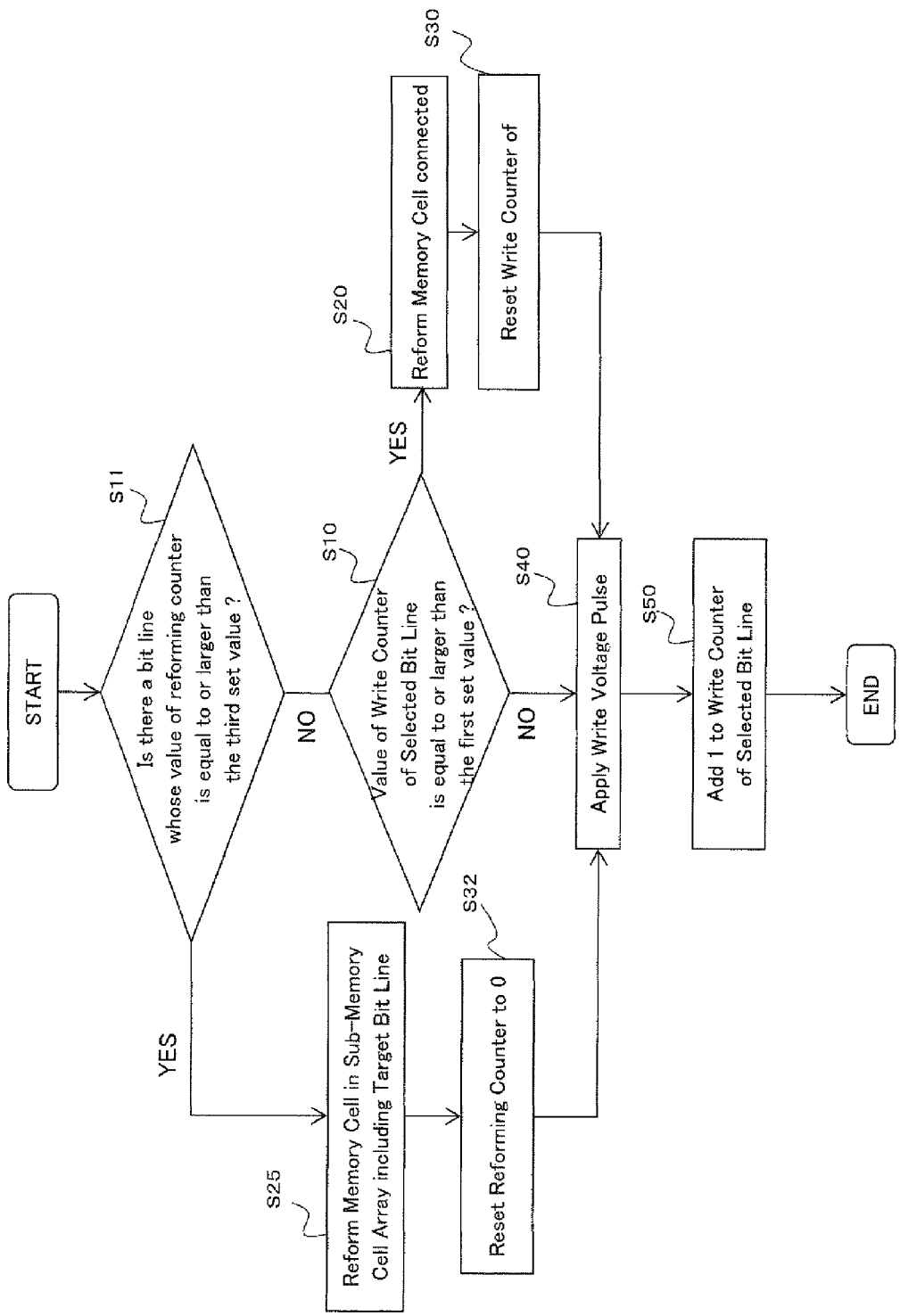
FIG. 17 shows another example of an operation flowchart during programming or erasing in the present invention.

FIG. 17 is a flowchart showing programming and erasing operations of the present invention device 4. In the programming or erasing operation of a selected memory cell in the memory cell array 15a, the control circuit 20 first reads the number of times of application of a reforming voltage pulse held in the reforming counter 32, and determines whether the read number reaches the predetermined third set value (100000, for example) (step S11).

As a result, when the number of times of application of the reforming voltage pulse is equal to or larger than the third set value, the control circuit 20 performs the reforming operation to all memory cells in the sub-memory cell array to which memory cells connected to the selected bit line belong (step S25).

When the reforming operation is completed in step S25, the control circuit 20 resets the count values held in the reforming counter 32 belonging to the bit line in the sub-memory cell array to zero, respectively (step S32).

Thereafter, the control circuit 20 performs the programming or erasing operation in step S40. The control circuit 20 controls the bit line decoder 16, the word line decoder 17, and the write voltage application circuit 22a to apply a write voltage pulse to the selected memory cell, and to program or erase data into or from this cell.

On the other hand, when the number of times of application of the reforming voltage pulse is smaller than the third set value in step S11, the control circuit 20 further reads the number of times of application of the write voltage pulse to the selected bit line held in the write counter 30, and determines whether the number of times of application reaches the first set value (10000, for example) (step S10).

As a result, when the number of times of writing reaches the first predetermined value, the control circuit 20 performs the reforming operation to all memory cells connected to the selected bit line (step S20).

When the reforming operation is completed in step S20, the control circuit 20 resets the count value of the selected bit line held in the write counter 30 to zero (step S30), and thereafter, performs the programming or erasing operation in step S40.

When application of the write voltage pulse is completed, the control circuit 20 adds 1 to a numerical value of the number of times of writing to the selected bit line in the write counter 30 (step S50), and finishes the programming operation or the erasing operation.

The present embodiment can be performed by combining with the configurations of the first to third embodiments.

Fifth Embodiment

In the embodiments described above, the present invention is applied to the semiconductor memory device that has the memory cell array 15 having 1R type memory cells arranged in a matrix shape. However, the application of the present invention is not limited by the structure of the memory cells. An example in which the memory cell array has 1T1R type memory cells will be described below.

Figure 18:
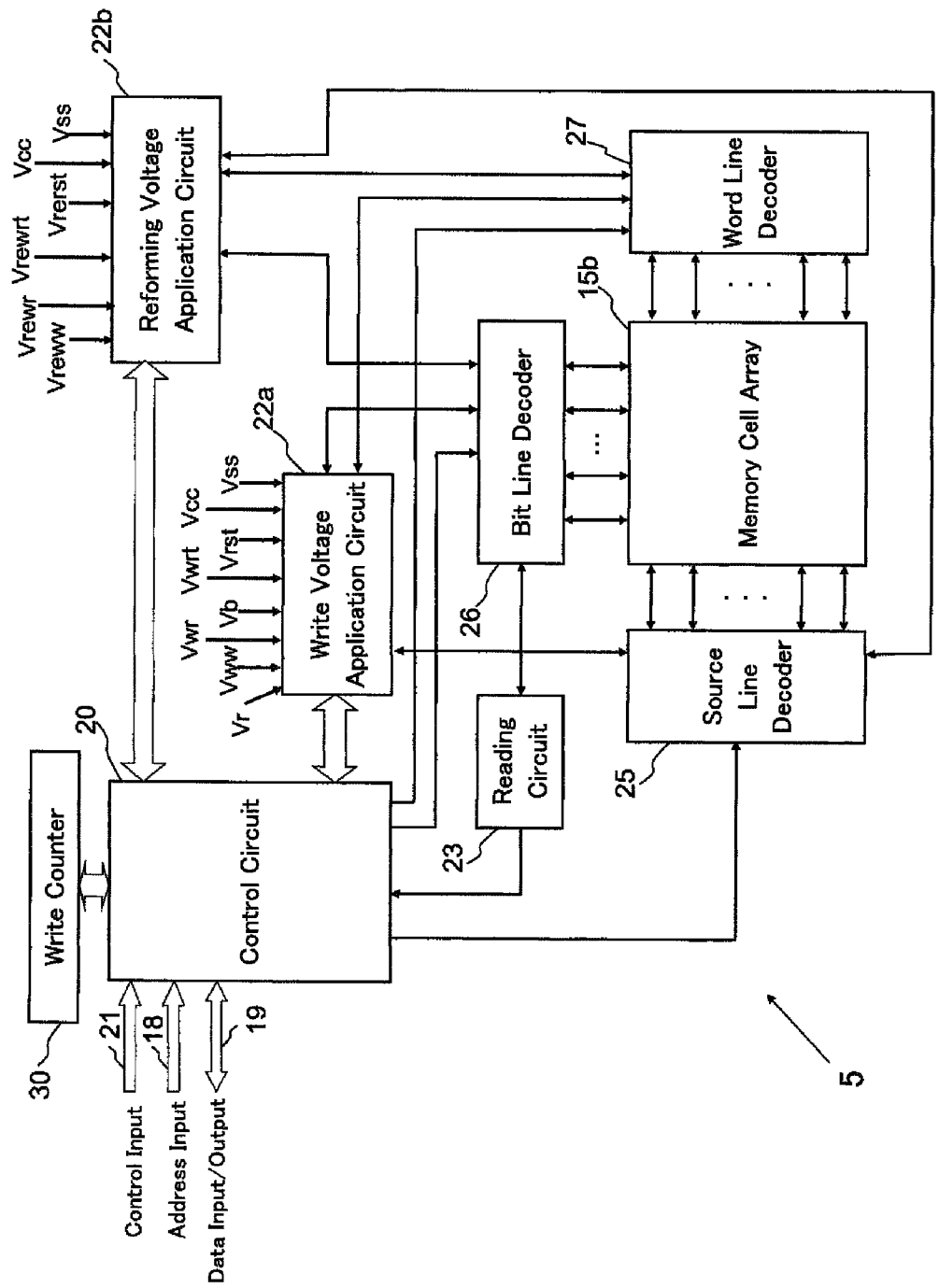
FIG. 18 is a circuit block diagram showing a configuration example of a semiconductor memory device according to a fifth embodiment of the present invention.

FIG. 18 shows a configuration example of a semiconductor memory device (hereinafter, appropriately referred to as "present invention device 5") according to an embodiment of the present invention. In FIG. 18, a portion that is common to that of the conventional semiconductor memory device is denoted with a common reference symbol. As shown in FIG. 18, the present invention device 5 includes a bit line decoder 26, a word line decoder 27, a source line decoder 25, the control circuit 20, the write voltage application circuit 22a, the reforming voltage application circuit 22b, the reading circuit 23, and the write counter 30, around the memory cell array 15b having 1T1R type memory cells (see reference symbol 14b in FIG. 19) arranged in a matrix shape. The present invention device 5 is a configuration example in which the 1T1R type memory cells are employed in place of the 1R type memory cells 14 in the above-described present invention device 1.

Figure 19:
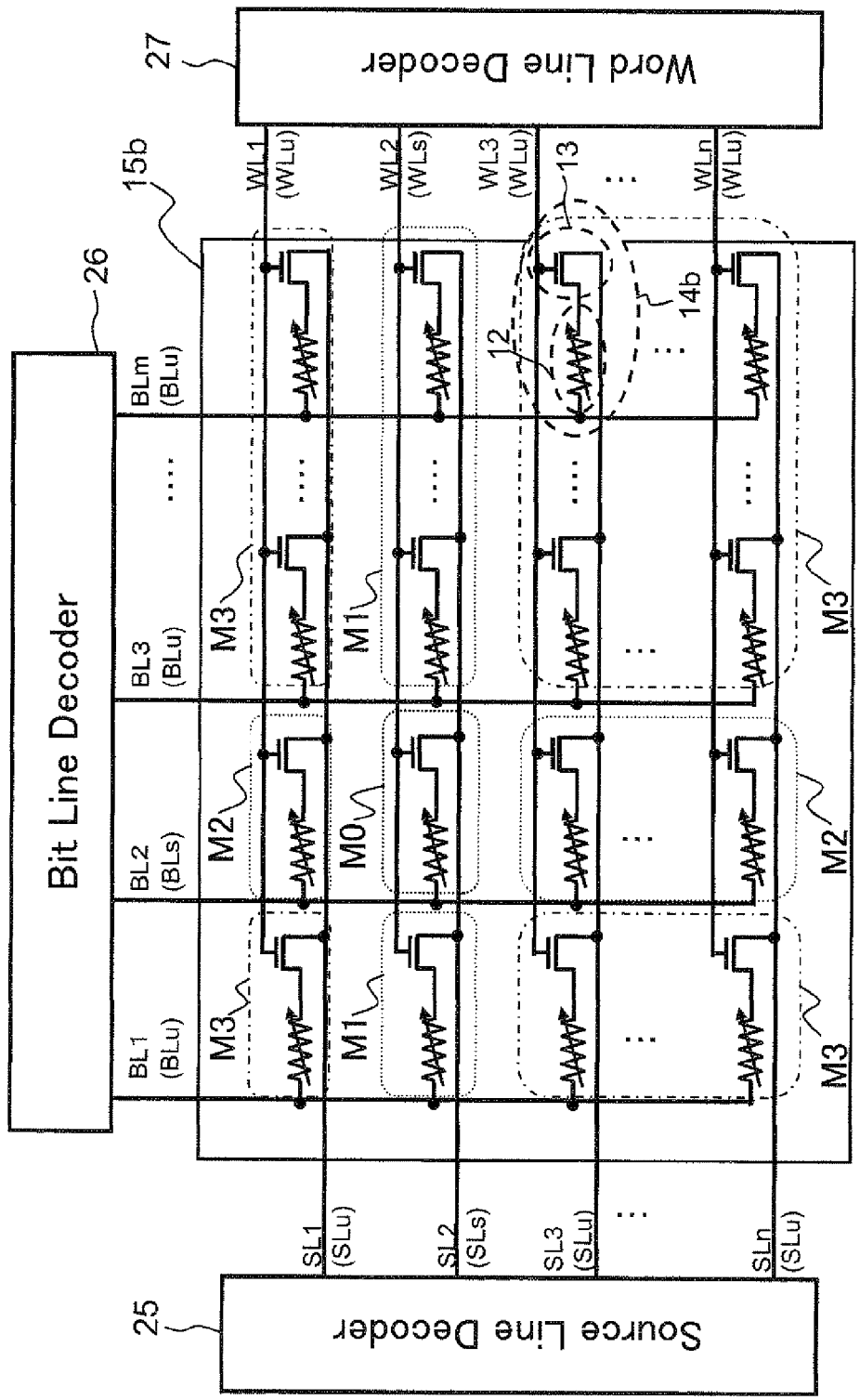
FIG. 19 shows a circuit configuration of a memory cell array that includes 1T1R type memory cells.

The memory cell array 15b has a similar configuration to that of the memory cell array in the conventional semiconductor memory device. Specifically, as shown in FIG. 19, the memory cell array 15b has m×n memory cells 14b arranged at cross points of m bit lines (corresponding to a column selection line) BL1 to BLm that extend in a column direction and n word lines (corresponding to a row selection line) WL1 to WLn that extend in a row direction. Further, n source lines (SL1 to SLn) are arranged in parallel with the word lines. In each memory cell, an upper electrode of the variable resistance element 12 and a drain of the select transistor 13 are connected together, a lower electrode of the variable resistance element 12 is connected to a bit line, a gate electrode of the select transistor 13 is connected to a word line, and a source of the select transistor 13 is connected to a source line. The lower electrode of the variable resistance element 12 is connected to the drain of the select transistor 13, the upper electrode of the variable resistance element 12 is connected to the bit line, and a relationship between the upper electrode and the lower electrode of the variable resistance element 12 may be reversed. In addition, a relationship between the source and the drain of the select transistor 13 may be reversed.

The bit line decoder 26 selects a bit line of the memory cell array 15b corresponding to an address signal that is inputted to the address line 18, and the word line decoder 27 selects a word line of the memory cell array 15b corresponding to an address signal that is inputted to the address line 18. Further, the source line decoder 25 selects a source line of the memory cell array 15b corresponding to an address signal that is inputted to the address line 18. That is, in the present embodiment, the bit line decoder 26, the word line decoder 27, and the source line decoder 25 function as a memory cell selecting circuit that selects a memory cell to which at least one operation is to be performed in the memory cell array 15b corresponding to an address input that is inputted from the address line 18 to the control circuit 20.

The control circuit 20 controls each operation of programming, erasing, reading, and reforming of the memory cell array 15b. The control circuit 20 controls the bit line decoder 26, the word line decoder 27, the source line decoder 25, the write voltage application circuit 22a, and the reforming voltage application circuit 22b to perform each operation of reading, programming, erasing, and reforming of the memory cell array 15b, based on an address signal inputted from the address line 18, a data input signal (during programming) inputted from the data line 19, and a control input signal inputted from the control signal line 21. In the example shown in FIG. 18, although not shown in the figure, the control circuit 20 includes functions as a general address buffer circuit, a data input/output buffer circuit, and a control input buffer circuit.

The write voltage application circuit 22a switches, according to an operation mode, each voltage of a word line, a bit line, and a source line necessary upon reading, programming, and erasing of the memory cell array 15b, and supplies the switched voltage to the memory cell 14b to be operated in the memory cell array 15b via the bit line decoder 26, the word line decoder 27, and the source line decoder 25. In the present embodiment, in the programming or erasing operation, the write voltage application circuit 22a generates a predetermined write voltage pulse (a program voltage pulse and an erase voltage pulse), and applies this voltage pulse to a selected memory cell connected to one or a plurality of bit lines for the memory operation selected by the bit line decoder 26 and the source line decoder 25, via the decoders 25 or 26. In FIG. 18, Vcc denotes a power supply voltage of the present invention device 5, Vss denotes a ground voltage, Vwrt denotes a program voltage, Vrst denotes an erase voltage, Vww denotes a program gate voltage, Vwr denotes an erase gate voltage, Vb denotes a bias voltage of the memory cell array, and Vr denotes a read voltage.

The reforming voltage application circuit 22b can be built in the write voltage application circuit 22a. The reforming voltage application circuit 22b generates a reforming voltage pulse necessary during reforming of the memory cell array 15b, and applies the generated reforming voltage pulse to a memory cell to which a reforming operation is to be performed in the memory cell array 15b, via the bit line decoder 26 or the source line decoder 25. In FIG. 18, Vcc denotes a power supply voltage of the present invention device 5, Vss denotes a ground voltage, Vrewrt denotes a program reforming voltage, Vrerst denotes an erase reforming voltage, Vreww denotes a reforming program voltage, and Vrewr denotes a reforming erase gate voltage.

Figure 20:
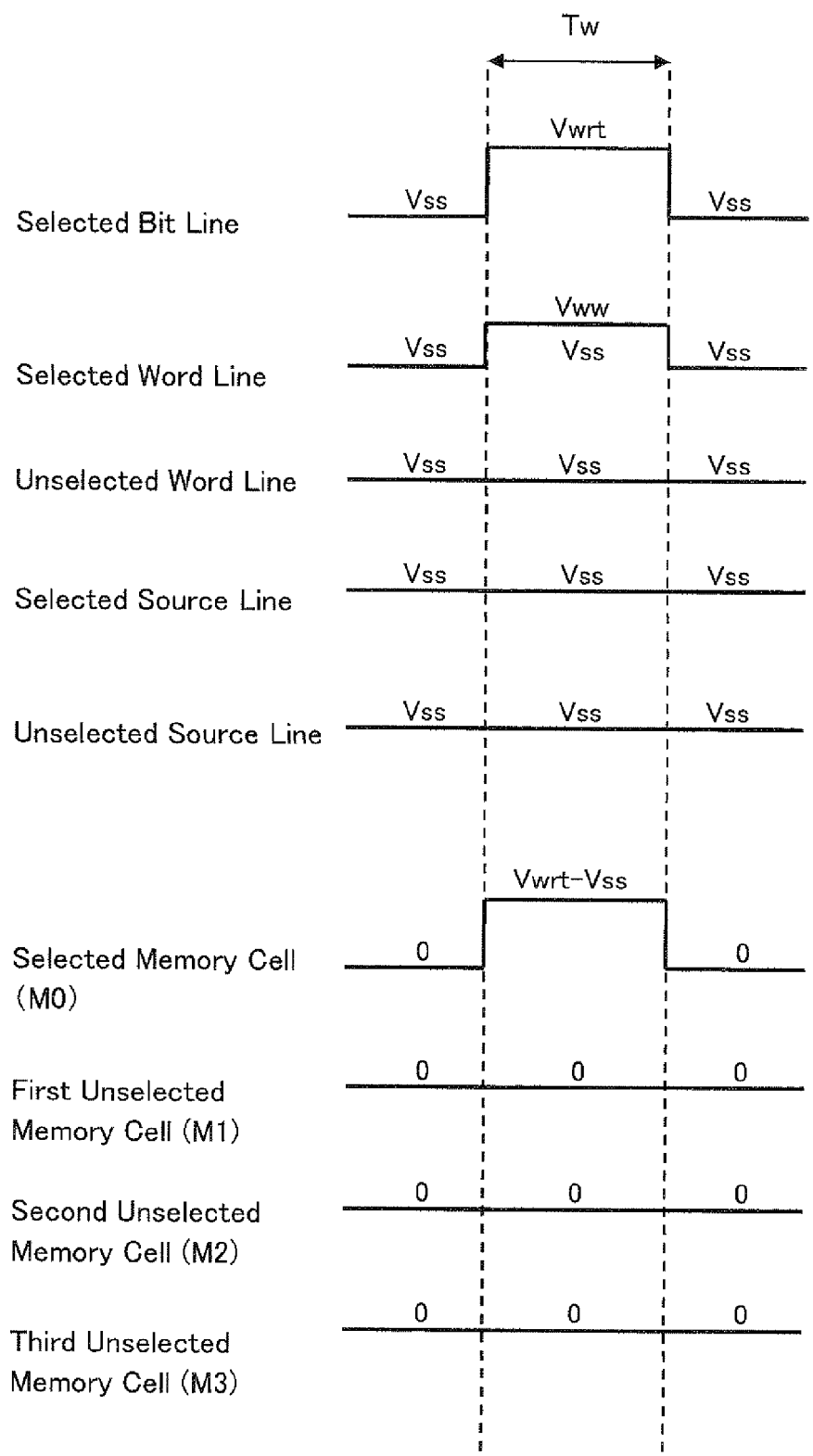
FIG. 20 shows an example of a voltage application procedure to a memory cell array during a programming operation in the memory cell array that includes 1T1R type memory cells.
Figure 21:
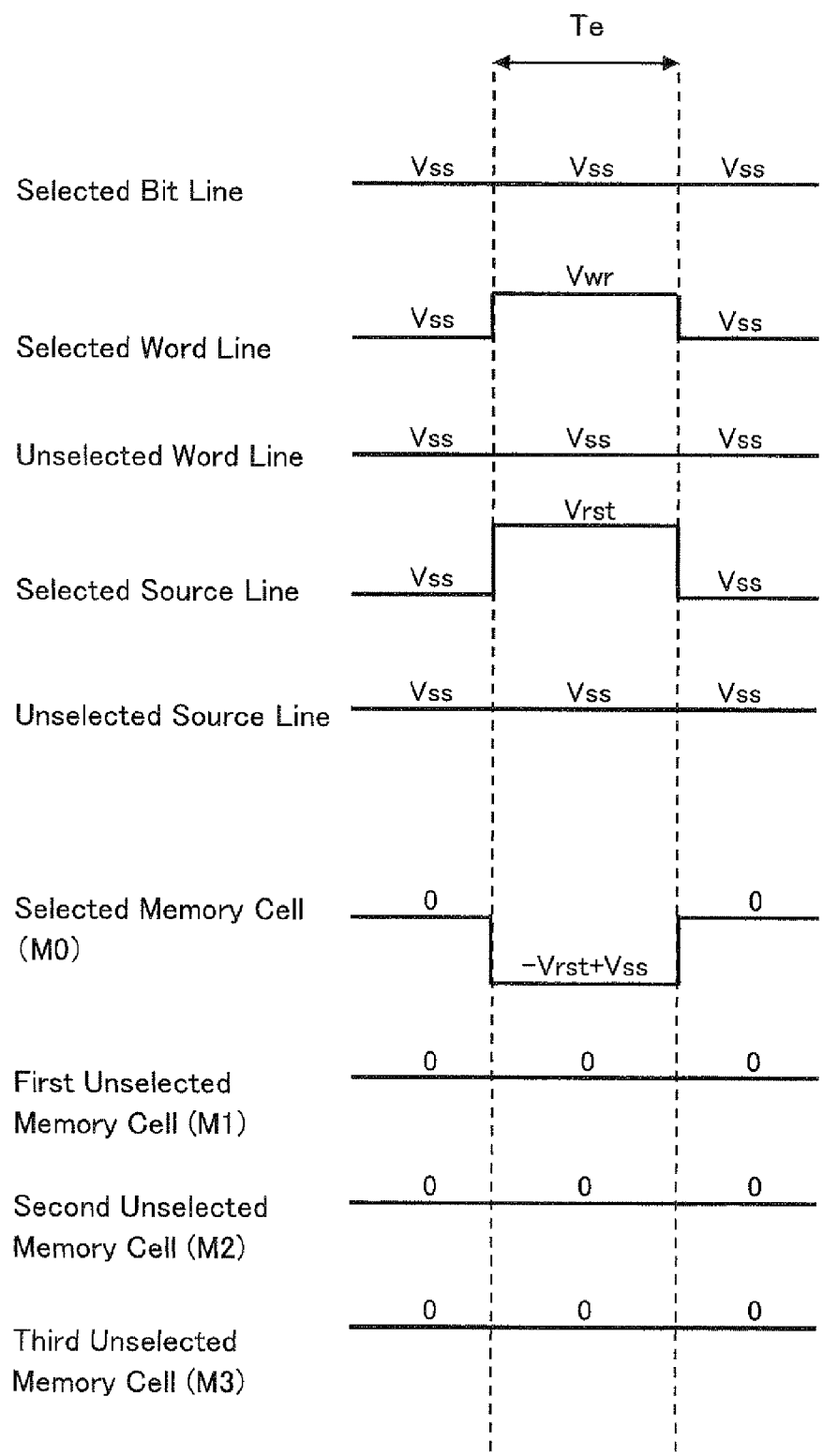
FIG. 21 shows an example of a voltage application procedure to a memory cell array during an erasing operation in the memory cell array that includes 1T1R type memory cells.

FIG. 20 shows an example of a voltage application procedure to each part during a programming operation in the memory cell array 15b configured by the 1T1R type memory cells 14b. Similarly, FIG. 21 shows an example of a voltage application procedure during an erasing operation. In the following example, a specific example is described in which a programming operation or an erasing operation is performed to a memory cell M0 that is specified by the bit line BL2 and the word line WL2 in FIG. 19. As shown in FIG. 20, when programming data into the selected memory cell M0, a selected source line SLs connected to the selected memory cell M0 is maintained at the ground potential Vss, and during a programming period Tw, an unselected bit line BLu is open, the ground potential Vss is applied to an unselected source line SLu and an unselected word line WLu, the program gate voltage Vww is applied to the selected word line WLs, and the program voltage Vwrt is applied to the selected bit line BLs. During the programming period Tw, a potential of the unselected bit line BLu may be set to the ground potential Vss. With this arrangement, during the programming period Tw, a voltage difference Vw (=Vwrt−Vss) equal to or larger than a threshold value necessary for a programming operation occurs between the selected bit line BLs and the selected source line SLs in only the selected memory cell M0, and the resistance state of the variable resistance element of the selected memory cell changes.

On the other hand, when data is erased from the selected memory cell M0, a voltage having the polarity opposite to that in the programming is applied to the variable resistance element of the selected memory cell M0. As shown in FIG. 21, the selected bit line BLs connected to a selected memory cell is maintained at the ground potential Vss, and during the erasing period Te, the unselected bit line BLu is open, the ground potential Vss is applied to the unselected source line SLu and the unselected word line WLu, a program gate voltage Vwr is applied to the selected word line WLs, and a program voltage Vrst is applied to the selected source line SLs. A potential of the unselected bit line BLu during the erasing period Te may be set to the ground potential Vss. With this arrangement, during the erasing period Te, a voltage difference Ve (=Vss−Vrst) equal to or larger than a threshold value necessary for the erasing operation of the memory cell occurs between the selected bit line BLs and the selected source line SLs in only the selected memory cell M0, and the resistance state of the variable resistance element of the selected memory cell changes.

Figure 22:
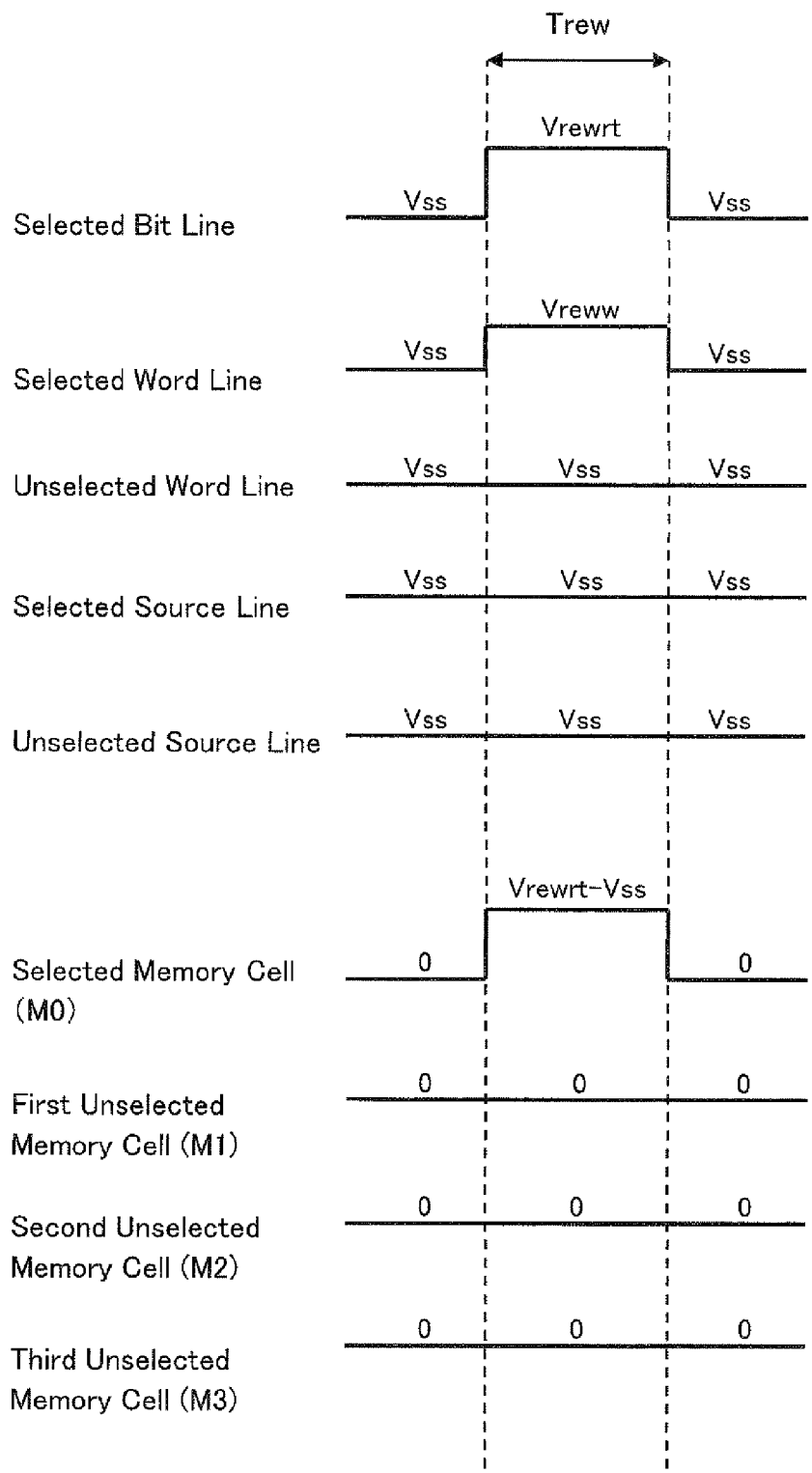
FIG. 22 shows an example of a voltage application procedure to a memory cell array during program reforming in the memory cell array that includes 1T1R type memory cells.
Figure 23:
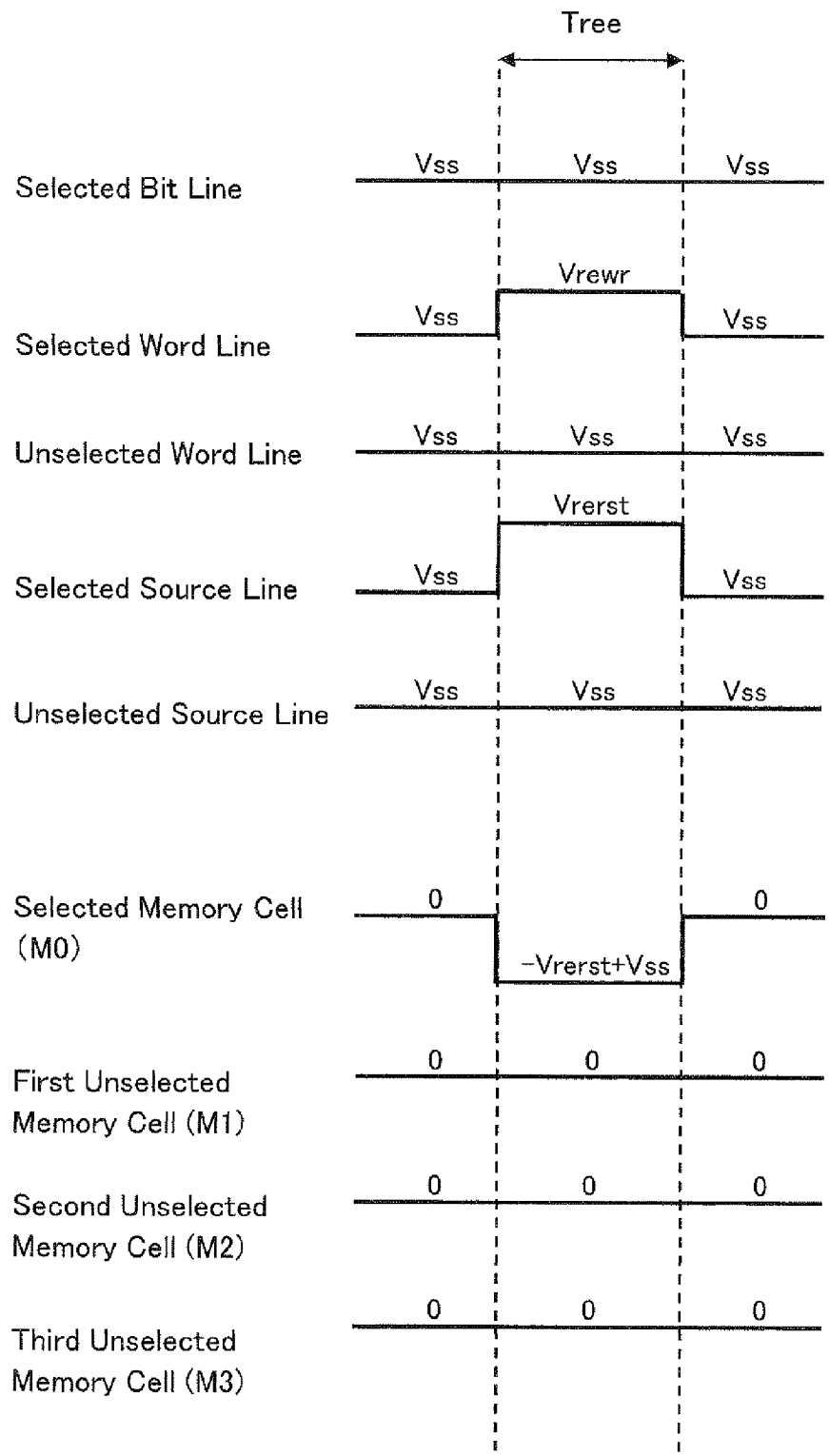
FIG. 23 shows an example of a voltage application procedure to a memory cell array during erase reforming in the memory cell array that includes 1T1R type memory cells.

Next, FIG. 22 shows an example of a voltage application procedure to each part during program reforming in the memory cell array 15b configured by the 1T1R type memory cells 14b. Similarly, FIG. 23 shows an example of a voltage application procedure to each part during erase reforming. In the following example, by selecting the bit line BL2, all memory cells connected to the bit line BL2 are reformed, by sequentially selecting any one of the word lines WL1 to WLn, and by reforming each memory cell. Among others, specifically, a case of performing a reforming operation to a memory cell specified by the bit line BL2 and the word line WL2 will be described as an example.

As shown in FIG. 22, when the program reforming is performed, a selected source line connected to a selected memory cell is maintained at the ground potential Vss. During the program reforming period Trew, the unselected bit line BLu is open, the ground potential Vss is applied to the unselected source line SLu and the unselected word line WLu, the program gate voltage Vreww is applied to the selected word line WLs, and the program voltage Vrewrt is applied to the selected bit line BLs. A potential of the unselected bit line BLu during the programming period Trew can be set to the ground potential Vss. With this arrangement, during the program reforming period Trew, a voltage Vrew (=Vrewrt−Vss) equal to or larger than a threshold value necessary for the program reforming is applied between the selected bit line BLs and the selected source line SLs in only the selected memory cell M0.

The program reforming period Trew is set longer than the period Tw during which a program voltage pulse is applied. Pulse rise/fall periods are provided before and after the voltage Vrewrt is applied, and a voltage amplitude of a pulse is preferably slowly changed to avoid a rapid voltage change.

On the other hand, in the erase reforming, a voltage pulse having a polarity opposite to that in the program reforming is applied to the selected memory cell. As shown in FIG. 23, when the erase reforming is performed, the selected bit line BLs connected to the selected memory cell is maintained at the ground potential Vss, and during the erase reforming period Tree, the unselected bit line BLu is open, the ground potential Vss is applied to the unselected source line SLu and the unselected word line WLu, the program gate voltage Vrewr is applied to the selected gate line WLs, and the program voltage Vrerst is applied to the selected source line SLs. Here, a potential of the unselected bit line BLu during the program reforming period Tree can be set to the ground potential Vss. With this arrangement, during the erase reforming period Tree, a voltage Vree (=Vss−Vrerst) equal to or larger than a threshold value necessary for the erase reforming operation of the memory cell is applied between the selected bit line BLs and the selected source line SLs in only the selected memory cell M0.

The erase reforming period Tree is set longer than the period Te during which an erase voltage pulse is applied. Pulse rise/fall periods are provided before and after the voltage Vrerst is applied, and a voltage amplitude of a pulse is preferably slowly changed to avoid a rapid voltage change.

Configurations of the reading circuit and the write counter 30 and the detailed operation flow in the programming, erasing, and reforming are similar to the configuration of the present invention device 1 in the first embodiment, and therefore, descriptions thereof will not be given.

Although the reforming operation method described above is an example of a case of performing reforming to each memory cell by selecting the word lines one by one, it is also possible to simultaneously perform reforming to a plurality of memory cells connected to selected bit lines by simultaneously selecting a plurality of word lines, and to simultaneously perform reforming to all memory cells connected to the selected bit lines by selecting all word lines in the memory cell array.

The programming, erasing, and reforming operations may be performed by replacing a relationship between the bit line and the source line. The programming or erasing operation may be performed to a plurality of memory cells in a memory cell array by increasing the number of selected bit lines or by increasing the number of selected source lines. In this case, a voltage application condition is similar to that used when programming into a single memory cell.

Figure 24:
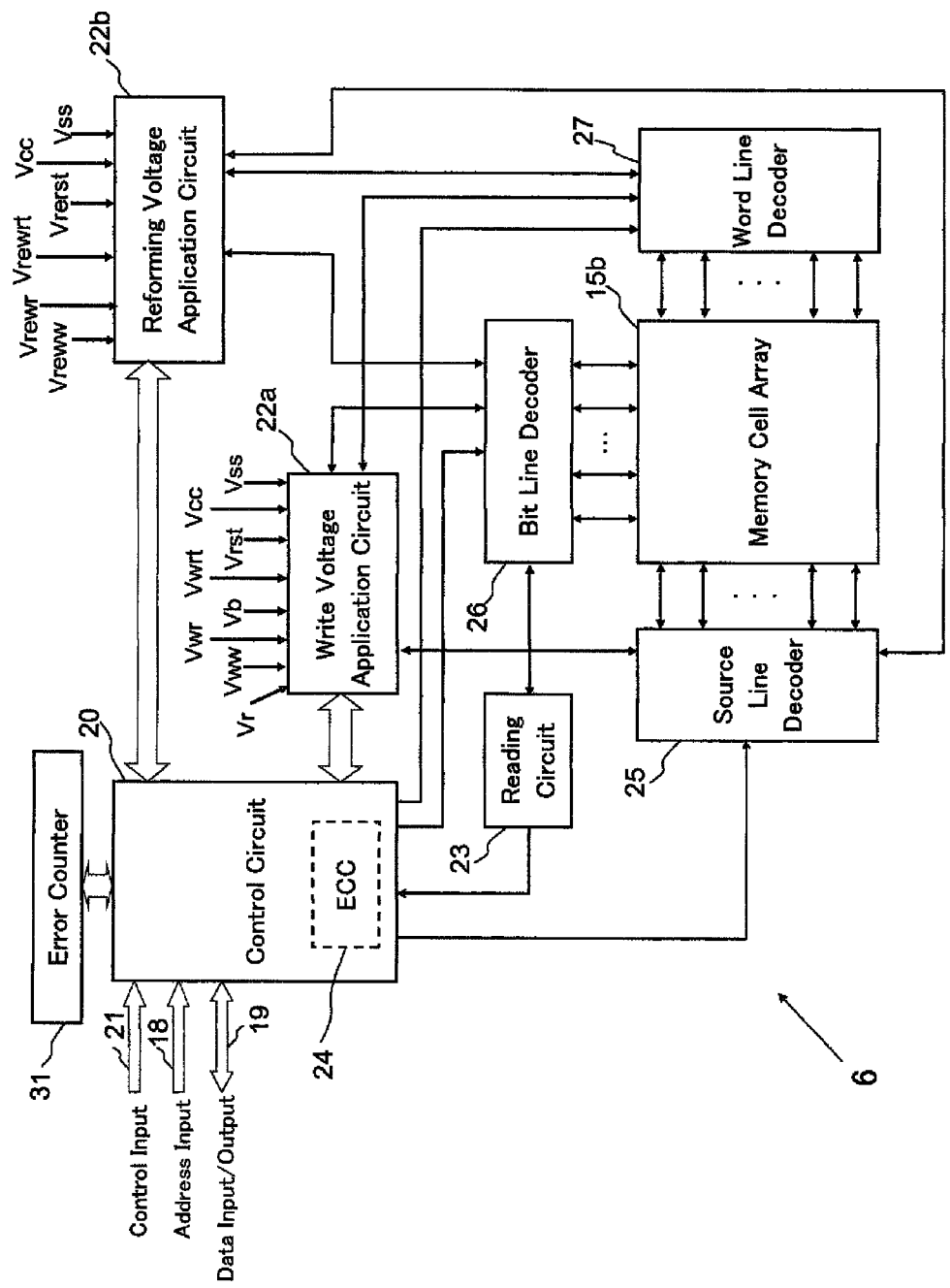
FIG. 24 is a circuit block diagram showing another configuration example of the semiconductor memory device according to the present invention.
Figure 25:
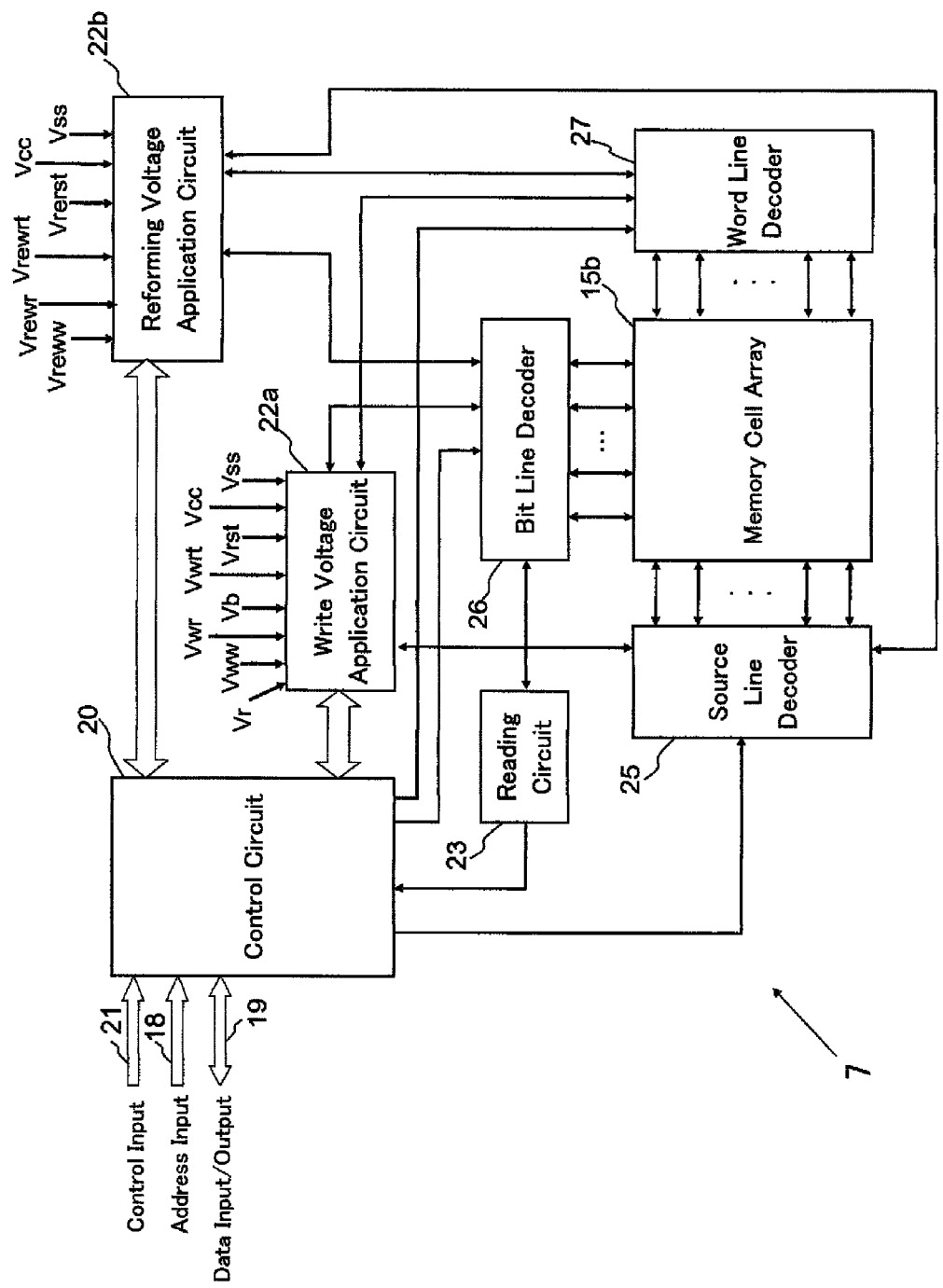
FIG. 25 is a circuit block diagram showing another configuration example of the semiconductor memory device according to the present invention.
Figure 26:
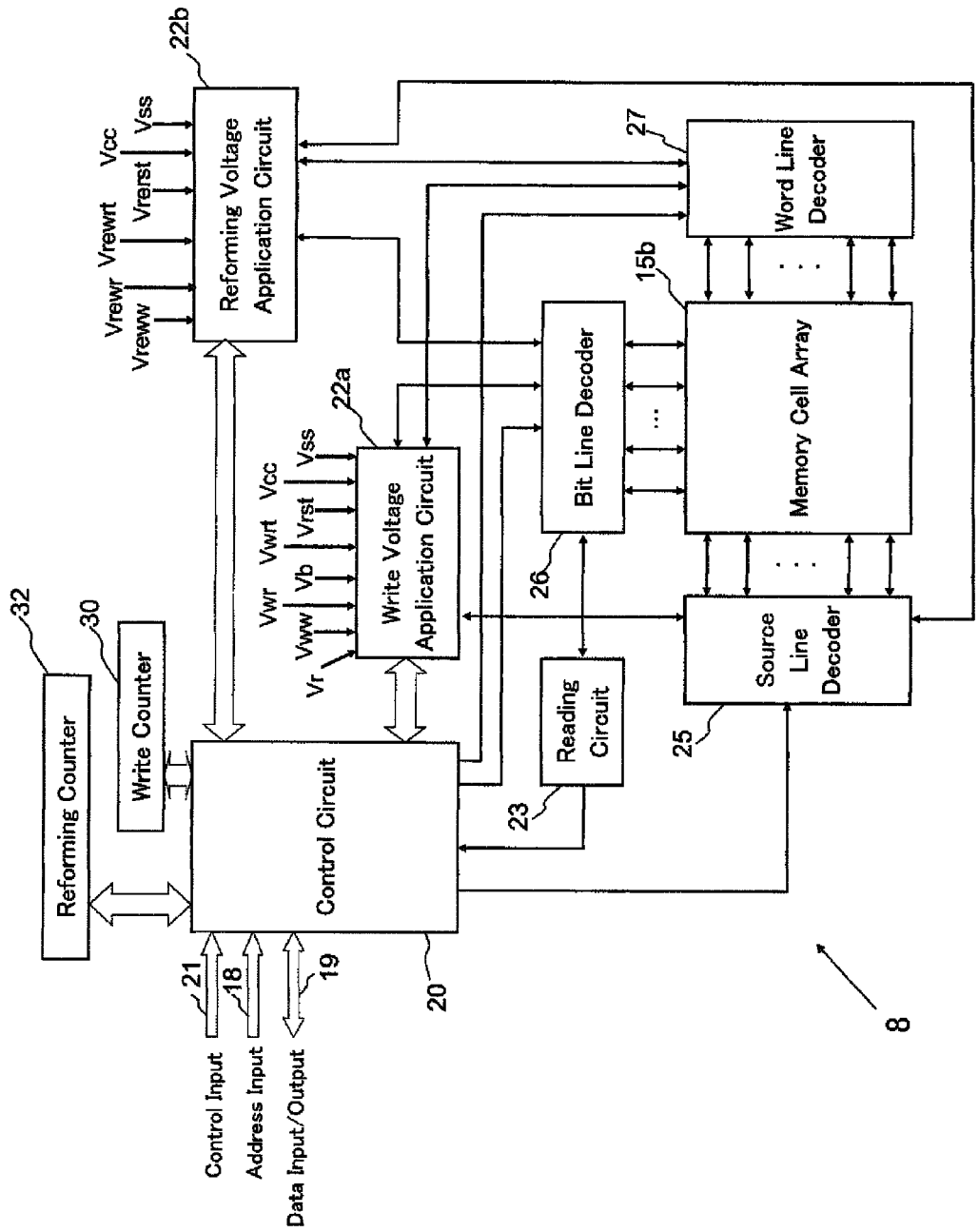
FIG. 26 is a circuit block diagram showing another configuration example of the semiconductor memory device according to the present invention.

FIGS. 24 to 26 each show another configuration example of the semiconductor memory device according to the present invention that includes 1T1R type memory cells. A semiconductor memory device (a present invention device 6) shown in FIG. 24 is an example in which a memory cell array is configured by 1T1R type memory cells in the present invention device 2 according to the second embodiment of the present invention, and the present invention device 6 controls reforming based on the count value of the error counter 31.

A semiconductor memory device (a present invention device 7) shown in FIG. 25 is an example in which a memory cell array is configured by 1T1R type memory cells in the present invention device 3 according to the third embodiment of the present invention. The present invention device 7 is configured such that a reading circuit detects a current flowing through a selected memory cell upon reading or upon application of a program voltage pulse, and reforming is controlled based on a result of the detection.

A semiconductor memory device (a present invention device 8) shown in FIG. 26 is an example in which a memory cell array is configured by 1T1R type memory cells in the present invention device 4 according to the fourth embodiment of the present invention. The present invention device 8 controls reforming based on the count value of the write counter 30 and a count value of a reforming detecting circuit.

The present invention devices having the above-described configurations can recover a switching characteristic of a variable resistance element, by applying a reforming voltage pulse to a memory cell that includes the variable resistance element to which the writing has been unsuccessful due to the degraded switching characteristic. Accordingly, a variation of a resistance value of stored data can be decreased, and a stable writing operation can be performed.

Modified Embodiments

Modified embodiments of the present invention will be described below.

(1) In the above embodiments, the examples of memory cell array configurations of 1R type memory cells and 1T1R type memory cells as two types of memory cell structures are described. However, the memory cell structure can be any structure other than the 1R type memory cells and the 1T1R type memory cells, as long as the resistance value of the variable resistance element can be changed due to formation and extinction of a filament of the variable resistance element. Although a selection transistor of the 1T1R type memory cells has been described by assuming an N-type MOSFET, this selection transistor can also be a P-type MOSFET.

(2) The present invention device 2 according to the second embodiment includes the ECC circuit 24 which determines, upon a read verification operation, whether the programming or erasing operation has been correctly performed, and determines whether reforming is necessary, based on the number of times of data correction by the ECC circuit 24. However, the ECC circuit 24 is not necessarily required. For example, in step S71 in FIG. 12, the control circuit 20 may detect the current flowing through the variable resistance element upon reading, and may determine whether the current voltage characteristic of the variable resistance element of the selected memory cell is within the first set range. When the current voltage characteristic is not within the first set range, the control circuit 20 adds 1 to the count value of the selected bit line held in the error counter 31 (step S80), and tries to perform the programming or erasing operation in step S60 again.

Figure 27:
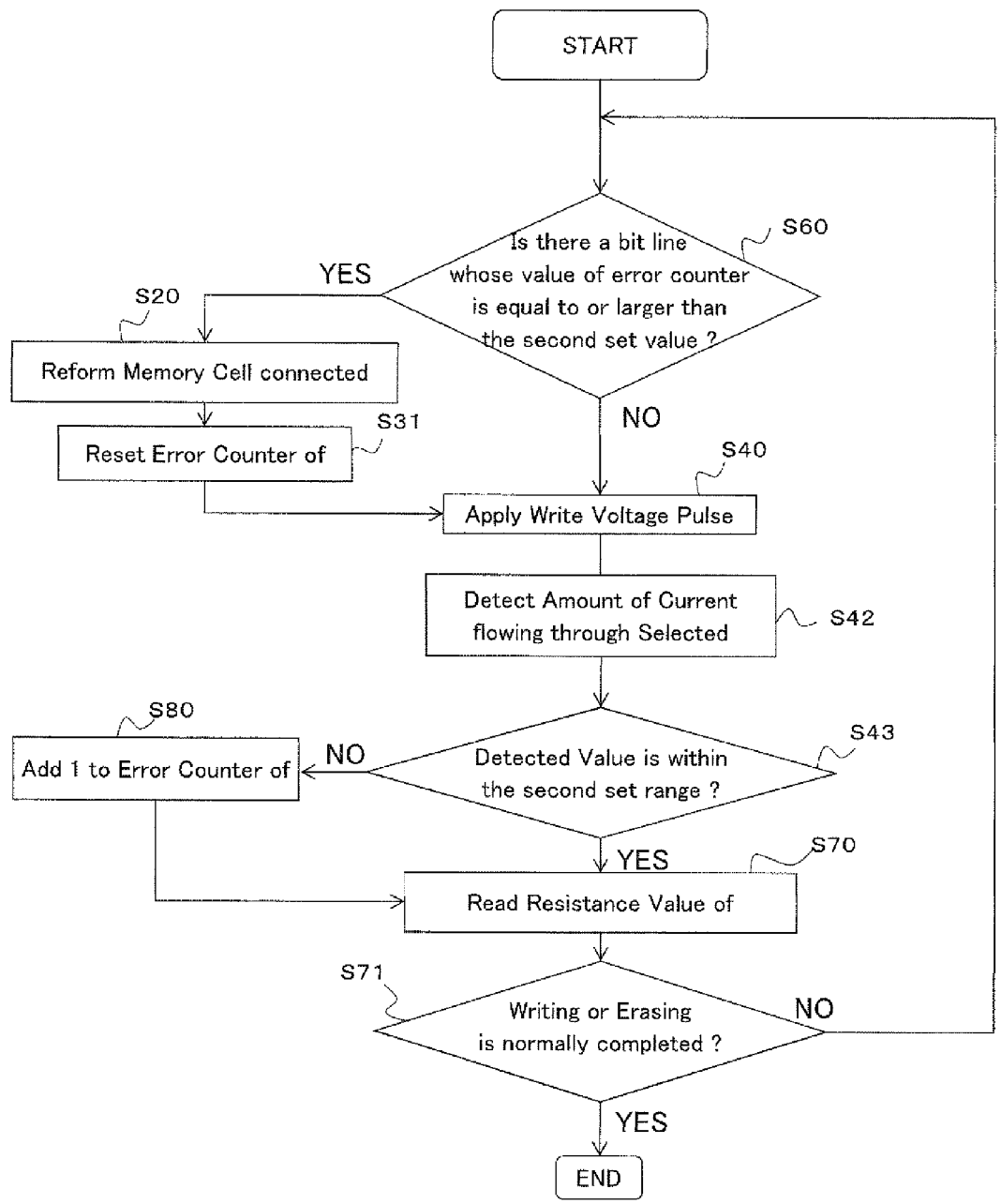
FIG. 27 shows another example of an operation flowchart during programming or erasing.

The control circuit 20 can be also configured to detect a current flowing through the variable resistance element when a write voltage pulse is applied, and increases or decreases the count value of the error counter 31 based on whether an amount of current flowing through the variable resistance element of the selected memory cell is within the second set range. FIG. 27 shows a flow of programming and erasing operations in this case. In the programming or erasing operation of the selected memory cell in the memory cell array 15*a*, the control circuit 20 first reads the count value of the selected bit line held in the error counter 30, and determines whether the read count value reaches a predetermined second set value (20, for example) (step S60).

As a result, when the count vale reaches the second set value, the control circuit 20 performs a reforming operation to all memory cells connected to the selected bit line (step S20). When the reforming operation is completed, the count value of the selected bit line held in the error counter 31 is reset to zero (step S31).

A write voltage pulse is applied to the selected memory cell in step S40. At the same time, the reading circuit 23 detects a current flowing through the selected memory cell when a programming pulse is applied (step S42), and determines whether an amount of the current is within the second set range (step S43).

As a result, when the amount of current detected by the reading circuit 23 is not within the second set range, the control circuit 20 adds 1 to the count value of the selected bit line held in the error counter 31 (step S80). Thereafter, the control circuit 20 reads the resistance state stored in the variable resistance element of the selected memory cell (step S70), and determines whether data of the selected memory cell is correctly written (step S71). When the data of the selected memory cell is not correctly written, the process returns to step S60 to apply the write voltage pulse again, and the control circuit 20 confirms the count value of the error counter, and tries to apply a write voltage pulse again.

(3) In the fifth embodiment, a memory cell array configuration of 1T1R type memory cells having a source line extended in a row direction for each row as shown in FIG. 19 is exemplified. However, the memory cell array configuration of the 1T1R type memory cells is not limited to the configuration of this embodiment. For example, the source line can be extended in a column direction in parallel with the bit line.

(4) In the first to fourth embodiments above, it is assumed that one word line and one bit line are selected, and a read current that flows through a selected memory cell connected to the selected bit line is read by selecting the read current at the bit line side. However, a relationship between the bit line and the word line may be reversed, and the read current may be read at the word line side. In this case, the reading circuit 23 is connected to the word line decoder 17 side. Similarly, in the fifth embodiment, it is assumed that one word line and one bit line are selected, and a read current that flows through a selected memory cell connected to the selected bit line is read at a bit line side by selecting the read current at the bit line side. However, the read current can be read at the source line side.

(5) In the embodiments described above, the write voltage application circuit 22*a* shown in FIGS. 1, 10, 13, 16, 18, and FIGS. 24 to 26 respectively generates a voltage of each operation of programming, erasing, and reading by one circuit block. Alternatively, the write voltage application circuit 22*a* may include circuits that individually generate a voltage of each of the above operations. Further, a reading voltage to be applied to a selected memory cell in the reading operation may be generated in each decoder. Similarly, the reforming voltage application circuit 22*b* shown in FIGS. 1, 10, 13, 16, 18, and FIGS. 24 to 26 respectively generates the voltage of the reforming operation by one circuit block. Alternatively, the write voltage application circuit 22*a* may generate the voltage of the reforming operation.

(6) In the above embodiments other than the third embodiment, the write counter 30, the error counter 31, or the reforming counter 32 is provided for each row or each column of the memory cell array. When the semiconductor memory device is used to access data in a certain lump data size without exception, this lump memory area is continuously read without exception. Therefore, the write counter 30, the error counter 31, or the reforming counter 32 may be provided in each area. That is, the write counter 30, the error counter 31, or the reforming counter 32 may be provided for two or more rows or columns.

(7) In the above embodiments, the configuration made of one memory cell array is assumed and described. When the semiconductor memory device is used to access data in a certain lump data size without exception, memory cells within a sub-memory cell array are continuously written or read without exception, when the memory cell arrays 15a and 15b are divided into a plurality of sub-memory cell arrays and also when the data size is set equal to capacity of the sub-memory cell array. Therefore, the write counter 30, the error counter 31, or the reforming counter 32 may be provided for each sub-memory cell array, and a reforming operation may be performed based on a state of this counter.

The present invention can be used for a semiconductor memory device. Particularly, the present invention can be used for a semiconductor memory device that includes a variable resistance element of which a resistance state transitions by application of a voltage and the resistance state after the transition is held in a nonvolatile manner.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. A semiconductor memory device comprising:
   a variable resistance element in which electrodes are supported at both ends of a variable resistor, a resistance state specified by a current-voltage characteristic between the electrodes transitions between two or more different resistance states by applying electrical stress between the electrodes at the both ends, and one of the resistance states after the transition is used for storing information;
   a circuit that applies a reforming voltage pulse to a memory cell including the variable resistance element whose resistance characteristic for at least one of the resistance states has been varied after an application of a write voltage pulse a plurality of times, in order to recover the resistance characteristic to be in an initial state of corresponding one of the resistance states, the reforming voltage pulse being different from any of the write voltage pulses that cause each of the resistance states of the variable resistance element to transition to a different state;
   a memory cell array having a plurality of memory cells, each including the variable resistance element, arranged in a row direction and a column direction respectively;
   a memory cell selecting circuit that selects one or a plurality of memory cells to which a memory operation is to be performed from among the memory cells in the memory cell array by controlling a voltage to be applied to each of the memory cells;
   a write voltage application circuit that generates the write voltage pulse and applies the write voltage pulse via the memory cell selecting circuit to the memory cells to be written selected by the memory cell selecting circuit;
   a reforming voltage application circuit that generates at least one reforming voltage pulse corresponding to any one of the write voltage pulses, and applies the reforming voltage pulse via the memory cell selecting circuit to the memory cells to be reformed selected by the memory cell selecting circuit; and
   a reading circuit that detects current flowing through the variable resistance element of each of the memory cells, wherein
   the write voltage application circuit applies any one of a first write voltage pulse and a second write voltage pulse to the memory cells to be written via the memory cell selecting circuit, the first write voltage pulse causing the resistance state of the variable resistance element to transition from a high resistance state to a low resistance state, and the second write voltage pulse causing the resistance state of the variable resistance element to transition from the low resistance state to the high resistance state; and
   the reforming voltage application circuit applies at least any one of a first reforming voltage pulse corresponding to the first write voltage pulse and a second reforming voltage pulse corresponding to the second write voltage pulse, to the memory cells to be reformed.

2. The semiconductor memory device according to claim 1, wherein
   at least one of the reforming voltage pulses is a long-pulse reforming voltage pulse of which a pulse applying time is longer than that of the write voltage pulse to which the reforming voltage pulse is related.

3. The semiconductor memory device according to claim 2, wherein
   an absolute value of a peak voltage of the long-pulse reforming voltage pulse is smaller than that of the write voltage pulse to which the long-pulse reforming voltage pulse is related.

4. The semiconductor memory device according to claim 2, wherein
   the long-pulse reforming voltage pulse has a pulse rise time or a pulse fall time which is longer than that of the write voltage pulse to which the long-pulse reforming voltage pulse is related.

5. The semiconductor memory device according to claim 2, wherein
   the long-pulse reforming pulse is a pulse in which an absolute value of an application voltage until reaching a peak voltage increases stepwise with time, or an absolute value of an application voltage after reaching a peak voltage decreases stepwise with time.

6. The semiconductor memory device according to claim 1, further comprising a counter that is used to determine whether application of the reforming voltage pulse is necessary.

7. The semiconductor memory device according to claim 1, further comprising:
   a write counter that stores the number of times of application of the write voltage applied by the write voltage application circuit via the memory cell selecting circuit, for each row or each column of the memory cell array, or for each sub-memory cell array formed by dividing the memory cell array, or for each memory cell array, wherein
   when a value of the write counter reaches a predetermined first set value, the reforming voltage application circuit applies the reforming voltage pulse to the memory cell related to the write counter, via the memory cell selecting circuit.

8. The semiconductor memory device according to claim 1, further comprising:
   an ECC circuit; and
   an error counter for each row or each column of the memory cell array, or for each sub-memory cell array formed by dividing the memory cell array, or for each memory cell array, wherein
   the error counter stores the number of times of error correction performed by the ECC circuit, in reading information stored in the memory cell related to the error counter in the memory cell array, and
   when a value of the error counter reaches a predetermined second set value, the reforming voltage application circuit applies the reforming voltage pulse to the memory cell related to the error counter, via the memory cell selecting circuit.

9. The semiconductor memory device according to claim 1, further comprising:
an error counter for each row or each column of the memory cell array, or for each sub-memory array formed by dividing the memory cell array, or for each memory cell array, wherein
the error counter stores the number of times the reading circuit detects that the current voltage characteristic of the variable resistance element of the memory cell related to the error counter in the memory cell array is outside a predetermined first set range, and
when a value of the error counter reaches a predetermined second set value, the reforming voltage application circuit applies the reforming voltage pulse to the memory cell related to the error counter, via the memory cell selecting circuit.

10. The semiconductor memory device according to claim 1, further comprising:
an error counter for each row or each column of the memory cell array, or for each sub-memory cell array formed by dividing the memory cell array, or for each memory cell array, wherein
the error counter stores the number of times the reading circuit detects that an amount of current flowing through the variable resistance element of the memory cell to be written related to the error counter in the memory cell array is outside a predetermined second set range, when the write voltage pulse is applied, and
when a value of the error counter reaches a predetermined second set value, the reforming voltage application circuit applies the reforming voltage pulse to the memory cell related to the error counter, via the memory cell selecting circuit.

11. The semiconductor memory device according to claim 1, further comprising:
a reforming counter that stores the number of times of application of the reforming voltage pulse, for each row or each column of the memory cell array, or for each sub-memory cell array formed by dividing the memory cell array, or for each memory cell array, wherein
when a value of the reforming counter reaches a predetermined third set value, the reforming voltage application circuit applies the reforming voltage pulse via the memory cell selecting circuit to all the memory cells in the sub-memory cell array that includes all the memory cells related to the reforming counter, or to all the memory cells in the memory cell array.

12. The semiconductor memory device according to claim 1, wherein
when the reading circuit detects that the current voltage characteristic of the variable resistance element in the memory cell array is outside a predetermined first set range,
the reforming voltage application circuit applies the reforming voltage pulse via the memory cell selecting circuit to the memory cell that includes the variable resistance element of which the current voltage characteristic is outside the first set range.

13. The semiconductor memory device according to claim 1, wherein
when the reading circuit detects that an amount of current flowing through at least one of the variable resistance elements to be written is outside a predetermined second set range when the write voltage pulse is applied,
the reforming voltage application circuit applies the reforming voltage pulse via the memory cell selecting circuit to the memory cell that includes the variable resistance element of which the amount of current is outside the second set range.

14. The semiconductor memory device according to claim 1, further comprising:
a reforming counter that stores the number of times of application of the reforming voltage pulse, for each row or each column of the memory cell array, or for each sub-memory cell array formed by dividing the memory cell array, or for each memory cell array, wherein
when a value of the reforming counter reaches a predetermined third set value, the reforming voltage application circuit applies the reforming voltage pulse via the memory cell selecting circuit to all the memory cells in the sub-memory cell array that includes all the memory cells related to the reforming counter, or to all the memory cells in the memory cell array.

15. The semiconductor memory device according to claim 1, wherein
the variable resistor contains an oxide or an oxynitride of a transition metal.

16. The semiconductor memory device according to claim 15, wherein
the variable resistor contains an oxide or an oxynitride of a transition metal selected from among Hf, Ta, Ti, Co, Ni and Cu.

17. The semiconductor memory device according to claim 1, wherein
the first reforming voltage pulse has a polarity opposite to the second reforming voltage pulse,
the reforming voltage application circuit applies the first reforming voltage pulse and the second reforming voltage pulse alternately to the memory cells to be reformed.

18. The semiconductor memory device according to claim 2, wherein
each of the reforming voltage pulses is a long-pulse reforming voltage pulse of which a pulse applying time is longer than that of the write voltage pulse to which the reforming voltage pulse is related.

* * * * *